(12) United States Patent
Shinkawata

(10) Patent No.: US 8,367,432 B2
(45) Date of Patent: Feb. 5, 2013

(54) MANUFACTURING METHOD OF SEMICONDUCTOR DEVICE

(75) Inventor: Hiroki Shinkawata, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 384 days.

(21) Appl. No.: 12/830,399

(22) Filed: Jul. 5, 2010

(65) Prior Publication Data

US 2011/0027917 A1 Feb. 3, 2011

(30) Foreign Application Priority Data

Jul. 28, 2009 (JP) ................................. 2009-175437

(51) Int. Cl.
*G01R 31/26* (2006.01)
(52) U.S. Cl. .............. 438/14; 438/16; 438/18; 438/462; 257/48; 257/618; 257/620; 257/E21.053
(58) Field of Classification Search .................... 438/14, 438/16, 18, 460, 462, 666; 257/48, 618, 257/620, E21.053
See application file for complete search history.

(56) References Cited

U.S. PATENT DOCUMENTS 5,981,971 A 11/1999 Miyakawa

FOREIGN PATENT DOCUMENTS

| JP | 10-256324 A | 9/1998 |
| JP | 2007-49067 A | 2/2007 |

*Primary Examiner* — Evan Pert
*Assistant Examiner* — Mark A Laurenzi
(74) *Attorney, Agent, or Firm* — Miles and Stockbridge P.C.

(57) ABSTRACT

To provide a manufacturing method of a semiconductor device capable of placing a larger number of alignment marks for lithography and PCM and at the same time, preventing information leakage from the PCM. In a portion of a first scribe region sandwiched between first semiconductor chip regions, a first region and a second region are placed in parallel to each other. The first region is equipped with at least one monitor selected from a first monitor for electrically evaluating at least either one of an active element (such as transistor) and a passive element (such as resistor or capacitor), a second monitor for dimensional control, and a third monitor for measuring film thickness. In the second region, an alignment mark for lithography is placed. In the cutting step, the first region is cut off.

19 Claims, 33 Drawing Sheets

MANUFACTURING METHOD OF SEMICONDUCTOR DEVICE

CROSS-REFERENCE TO RELATED APPLICATIONS

The disclosure of Japanese Patent Application No. 2009-175437 filed on Jul. 28, 2009 including the specification, drawings and abstract is incorporated herein by reference in its entirety.

BACKGROUND OF THE INVENTION

The present invention relates to a manufacturing method of a semiconductor device, in particular, a manufacturing method of a semiconductor device having a step of cutting a semiconductor wafer.

A semiconductor device is typically manufactured by a front-end process in which various wafer-level steps are performed and a back-end process including a scribing step.

A semiconductor wafer formed in the front-end process has a plurality of semiconductor chip regions which will respectively become semiconductor chips later and scribe regions located between any two of these semiconductor chip regions. The scribe regions are regions equipped for scribing (dicing) and at the same time, regions in which alignment marks for lithography and various monitors for process control (PCMs: process control monitors).

For example, in Japanese Patent Laid-Open No. 2007-49067 (Patent Document 1), a semiconductor wafer includes a first scribe region formed along a first direction. The first scribe region is divided into a first region and a second region by a virtual line parallel to the first direction. The first region has an alignment mark (alignment mark for lithography) region and the second region has a test mark (PCM) region.

In the back-end process, the semiconductor chip regions are subjected to various tests by using PCMs. A plurality of semiconductor regions are then cut into individual semiconductor chips by scribing. If the PCMs are not cut off in this step, they remain on the semiconductor chip. Confidential data on this semiconductor device and manufacturing method thereof are sometimes leaked from the remaining PCMs. A technology for preventing such information leakage is therefore proposed.

For example, a semiconductor wafer proposed in Japanese Patent Laid-Open No. Hei 10(1998)-256324 (Patent Document 2) is characterized in that an internal circuit of ROM (read only memory) is tested via a test pad formed on a scribe line and the test pad is broken when the wafer is cut along the scribe line.

[Patent Documents]
[Patent Document 1] Japanese Patent Laid-Open No. 2007-49067
[Patent Document 2] Japanese Patent Laid-Open No. Hei 10(1998)-256324

SUMMARY OF THE INVENTION

With miniaturization of semiconductor devices, their structure has also become complicated and the number of interconnect layers has increased, resulting in an increase in the total number of alignment marks for lithography and PCMs. It is therefore sometimes impossible to align all the alignment marks for lithography and PCMs as a single line pattern along an extending direction of a scribe region. In this case, it is necessary to align these alignment marks and PCMs as a pattern of a plurality of lines running parallel to each other along the extending direction of the scribe region.

When only one of the plural lines running parallel to each other is cut off by scribing, there is a possibility of information leakage occurring from the PCM contained in the remaining line.

In the case where the whole pattern of a plurality of lines running parallel to each other is cut off by scribing, the width to be cut by scribing becomes wider. A dicer exclusively used for dicing such a width is therefore necessary. In addition, an increase in the spacing to be scribed leads to an increase in the amount of debris generated by scribing. The debris thus generated may attach to a semiconductor chip and deteriorate the yield.

The present invention has been made to overcome the above-described problems. An object of the invention is to provide a manufacturing method of a semiconductor device capable of placing a larger number of alignment marks for lithography and PCMs and preventing information leakage from the PCMs.

A manufacturing method of a semiconductor device according to the present embodiment has the following steps: forming a first semiconductor wafer having a plurality of first semiconductor chip regions and a first scribe region; and cutting off a portion of the first scribe region of the first semiconductor wafer to separate the first semiconductor chip regions into individual first semiconductor chips. In a portion of the first scribe region sandwiched between any two of the first semiconductor chip regions, a first region and a second region are placed in parallel to each other. The first region has a first monitor for electrically evaluating at least either one of an active element and a passive element, a second monitor for dimensional control, and a third monitor for measuring film thickness. The second region has an alignment mark for lithography. In the cutting step, the first region is cut off.

According to the present embodiment, the first region and the second region are placed in parallel to each other in a portion of the first scribe region. This means that the first region and the second region are placed as patterns running in a plurality of lines parallel to each other along the first scribe region. This makes it possible to provide a larger number of alignment marks for lithography and PCMs.

When the first region is cut off, the first monitor for electrically evaluating at least either one of an active element and a passive element, a second monitor for carrying out dimensional control of it, and a third monitor for measuring a film thickness of it are all removed. As a result, information leakage from at least any one of the first to third monitors can be prevented.

DETAILED DESCRIPTION OF THE PREFERRED EMBODIMENTS

Embodiments of the invention will hereinafter be described referring to some drawings.

(Embodiment 1)

Figure 1:
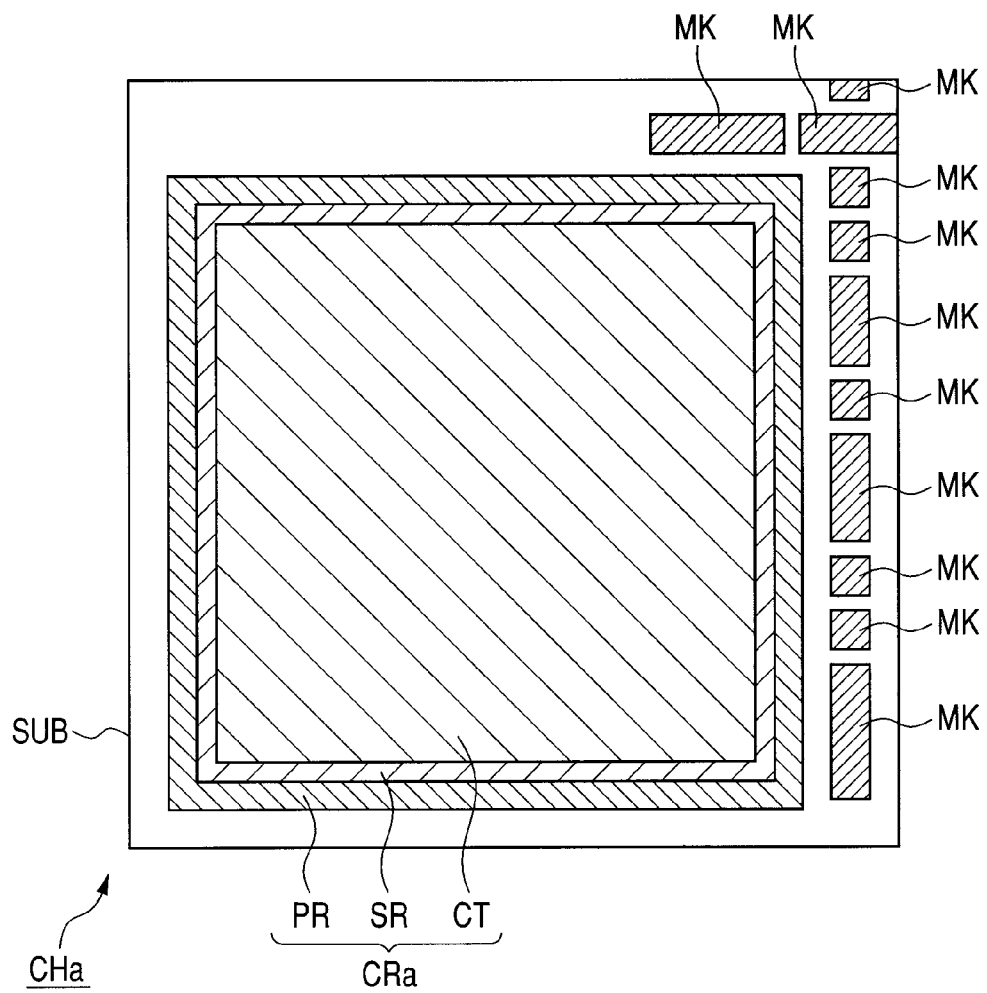
FIG. 1 is a plan view schematically illustrating the configuration of a first semiconductor chip formed by a manufacturing method of a semiconductor device in Embodiment 1 of the invention.
Figure 2:
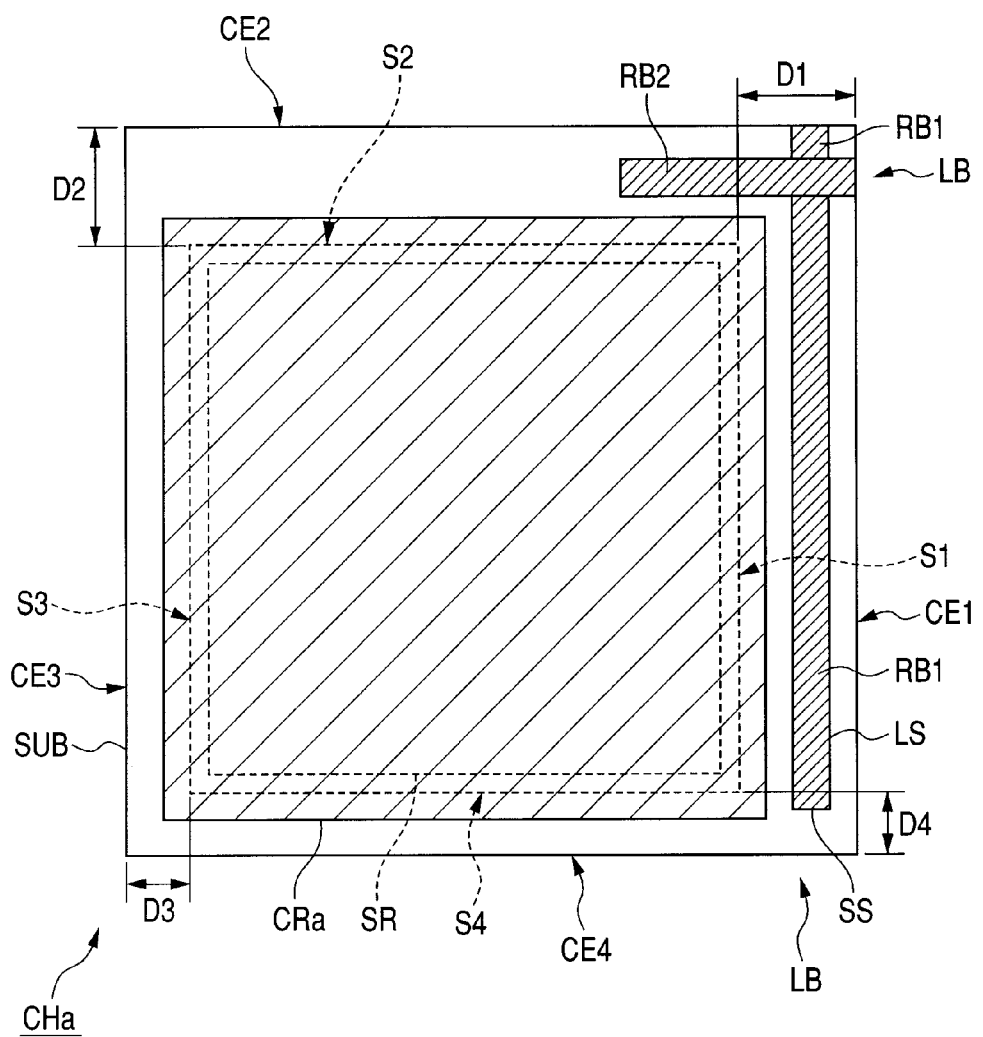
FIG. 2 is a plan view schematically illustrating the planar layout of the first semiconductor chip formed by the manufacturing method of a semiconductor device in Embodiment 1 of the invention.

When referred to FIGS. 1 and 2, a first semiconductor chip CHa formed in accordance with a manufacturing method of a semiconductor device in the present embodiment is surrounded by first to fourth chip end faces CE1 to CE4 in a planar view after a scribing step. The first to fourth chip end faces CE1 to CE4 are placed as four sides of a rectangle (including a square, which will equally apply hereinafter) in a planar view. The first chip end face CE1 and the third chip end face CE3 are parallel to each other, while the second chip end face CE2 and the fourth chip end face CE4 are parallel to each other.

The first semiconductor chip CHa has a semiconductor substrate SUB, a first semiconductor chip region CRa, and a plurality of alignment marks MK for lithography. The semiconductor substrate SUB is, for example, a silicon substrate. The first semiconductor chip region CRa and each of the alignment marks MK for lithography are formed over the semiconductor substrate SUB.

The first semiconductor chip region CRa has an internal circuit region CT, a seal ring SR, and an outer peripheral portion PR. The seal ring SR defines the first semiconductor chip region CRa with an annular form. This means that the seal ring SR partitions the internal circuit region CT located at the center of the first semiconductor chip region CRa from the peripheral portion PR located at the peripheral side of the first semiconductor chip region CRa.

More specifically, the seal ring SR is, in a planar view, surrounded by a first side S1 located along the first chip end face CE1, a second side S2 located along the second chip end face CE2, a third side S3 located along the third chip end face CE3, and a fourth side S4 located along the fourth chip end face CE4. The first side S1 and the third side S3 are arranged in parallel to each other, while the second side S2 and the fourth side S4 are arranged in parallel to each other.

A distance D1 between the first chip end face CE1 and the first side S1 is greater than a distance D3 between the third chip end face CE3 and the third side S3. A distance D2 between the second chip end face CE2 and the second side S2 is greater than a distance D4 between the fourth chip end face CE4 and the fourth side S4. Due to such a distance relationship, the first semiconductor chip region CRa is, in a planar view, deflected to each of the third chip end face CE3 and the fourth chip end face CE4. As a result, there is a space enough for locating second regions RB1 and RB2 between first chip end face CE1 and the first side S1 and between the second chip end face CE2 and the second side S2, respectively.

The plural alignment marks MK for lithography are used in a photolithography step and they are located in the second regions RB1 and RB2 (which will hereinafter be called "RB", collectively) along the first side S1 and the second side S2, respectively. The details of the second regions RB1 and RB2 and the alignment marks MK for lithography will be described later when the manufacturing method is described.

Figure 3:
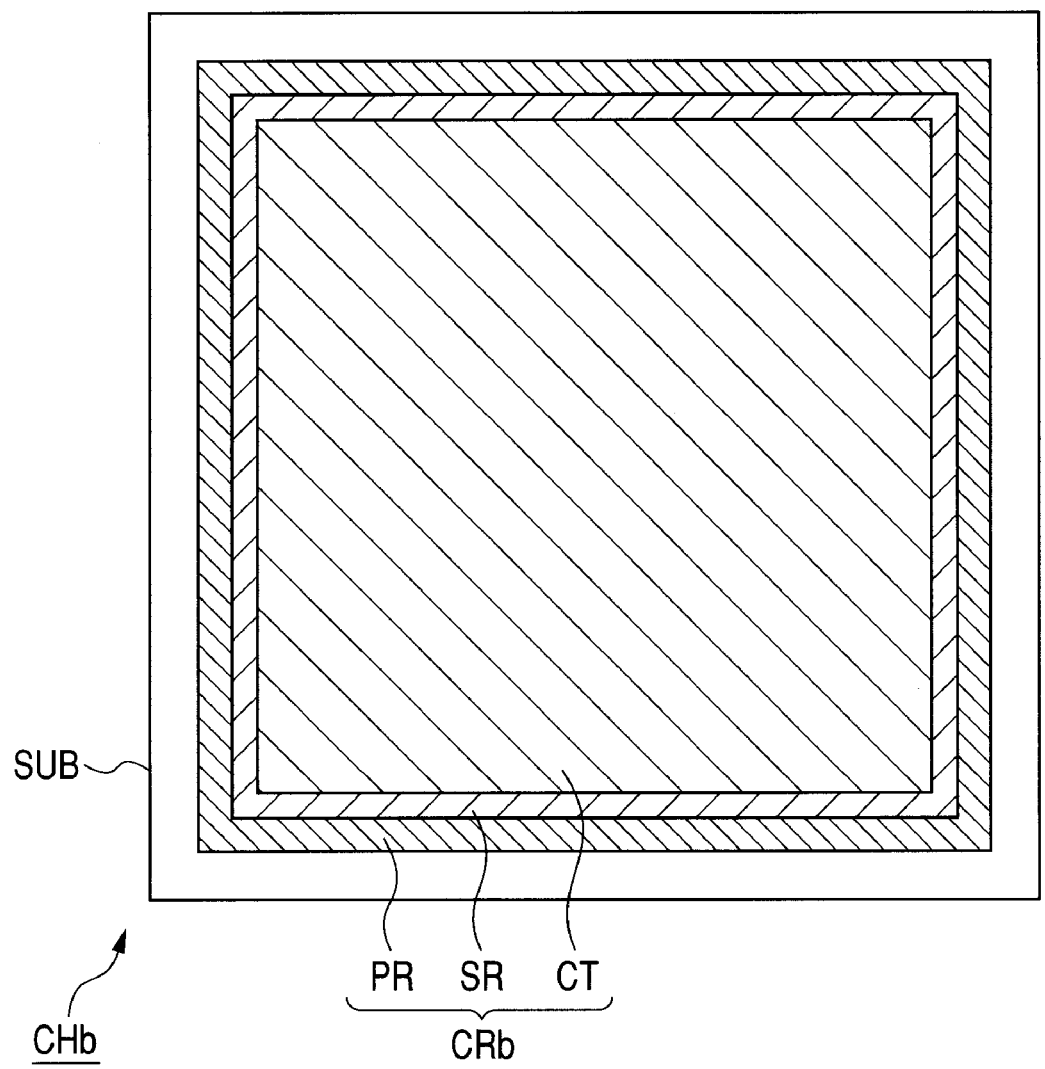
FIG. 3 is a plan view schematically illustrating the configuration of a second semiconductor chip formed by the manufacturing method of a semiconductor device in Embodiment 1 of the invention.

When referred mainly to FIG. 3, a second semiconductor chip CHb formed in the manufacturing method of a semiconductor device in the present embodiment does not have a second region RB, different from the first semiconductor chip CHa (FIG. 1). In addition, the second semiconductor chip region CRb is, different from the first semiconductor chip region CRa (FIG. 1), not deflected in the second semiconductor chip CHb in a planar view. The second semiconductor chip CHb has however a second semiconductor chip region CRb instead of the first semiconductor chip region CRa (FIG. 1) of the first semiconductor chip CHa.

Figure 4:
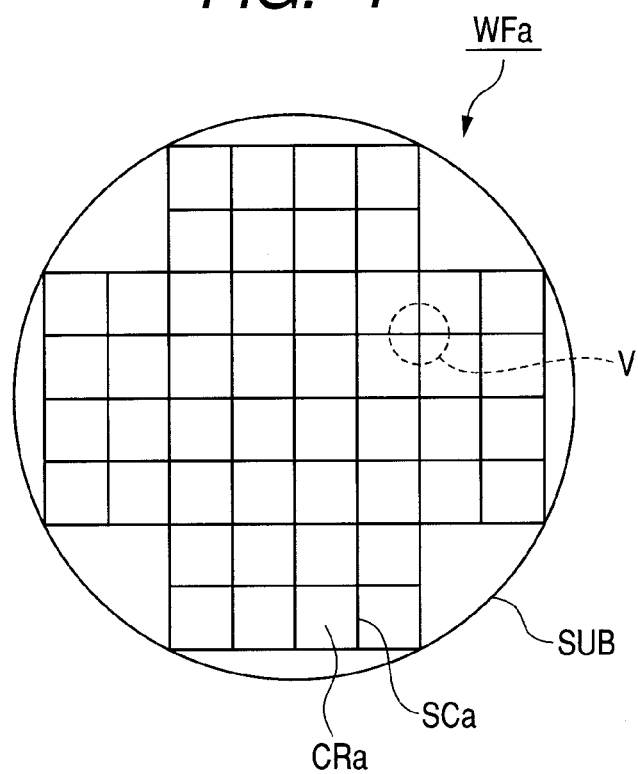
FIG. 4 is a plan view schematically illustrating the configuration of a first semiconductor wafer formed by the manufacturing method of a semiconductor device in Embodiment 1 of the invention.
Figure 5:
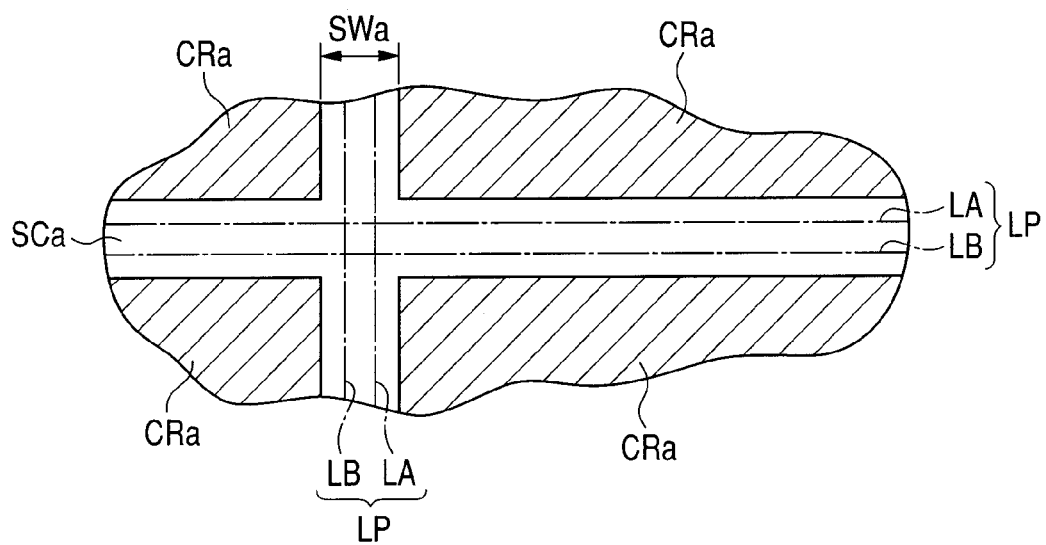
FIG. 5 is an enlarged view of a dashed line portion V of FIG. 4.

Next, a manufacturing method of the first semiconductor chip CHa (FIGS. 1 and 2) will be described. Referring to FIGS. 4 and 5, a first semiconductor wafer WFa is formed first. Described specifically, the first semiconductor wafer WFa is obtained by forming a plurality of first semiconductor chip regions CRa and a first scribe region SCa over a semiconductor substrate SUB by using a semiconductor manufacturing technology including photolithography.

The first scribe region SCa is sandwiched between two first semiconductor chip regions CRa adjacent to each other and it has a width SWa. The width SWa is wide enough to locate therein a plurality of lines LP, that is, a first line LA and a second line LB. The first line LA is a line for placing therein a first region which will be described later and is also a line in which in addition to the first region RB, a second region RB may be located. The second line LB is a line for placing therein the second region RB and it is a line in which the first region is not allowed to be located.

In the photolithography in the present embodiment, four (=2×2) first semiconductor chip regions CRa in FIG. 4 are exposed in one shot. A plurality of shots are carried out so that outer edges thereof be brought into contact with each other and as a result, the desired number of the first semiconductor chip regions CRa are exposed over the first semiconductor wafer WFa.

Figure 6:
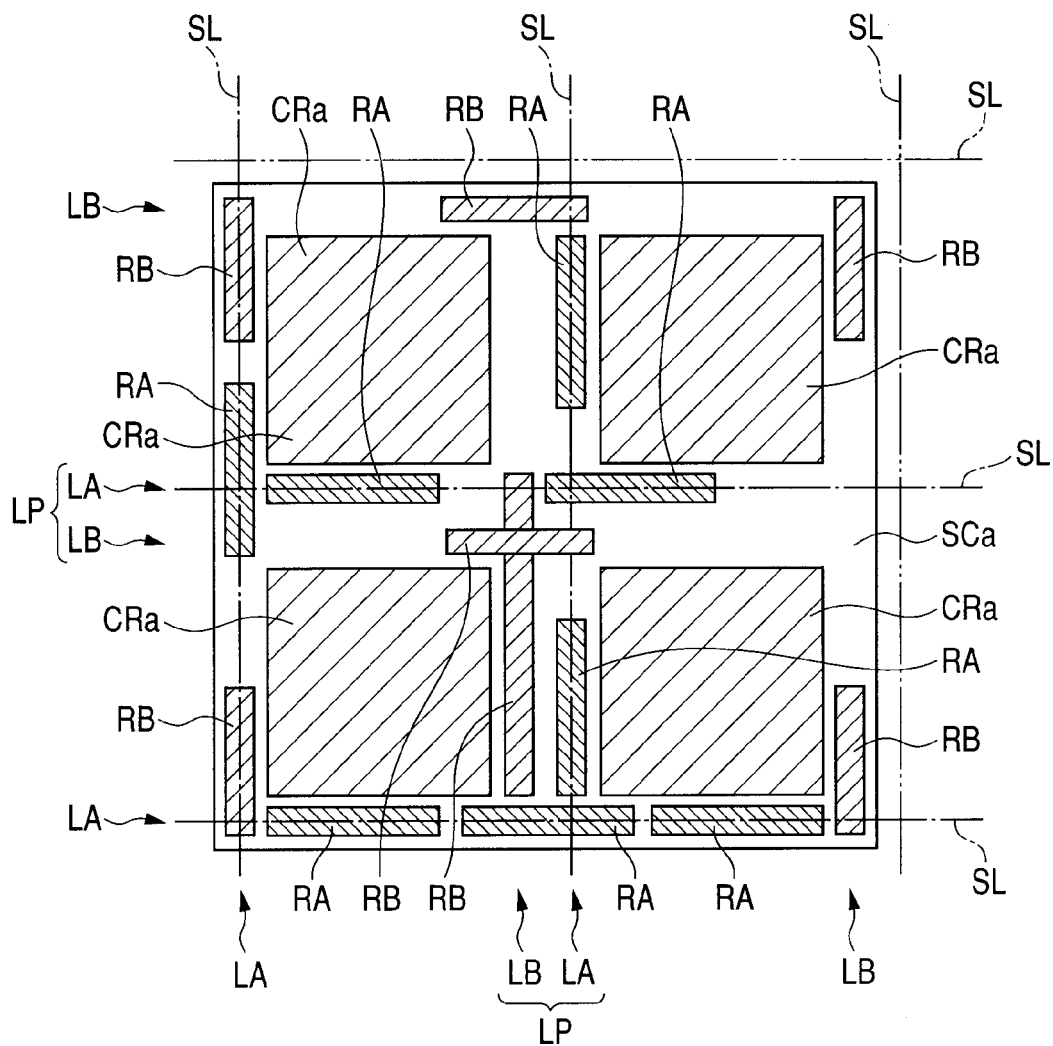
FIG. 6 is a view illustrating a region corresponding to one shot in FIG. 4.

Referring mainly to FIG. 6, regions corresponding to one shot in photolithography, in the first semiconductor wafer FWa, will next be described in further detail. In a portion of the first scribe region Sca sandwiched between two first semiconductor chip regions CRa adjacent to each other, the first region RA and the second region RB are arranged in parallel to each other.

Figure 8A:
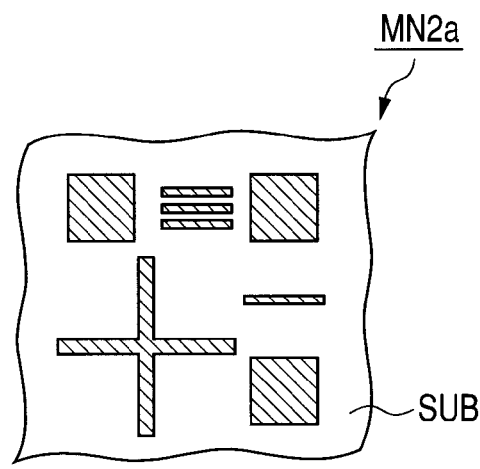
FIG. 8(A), FIG. 8(B), and FIG. 8(C) are plan views schematically illustrating the configurations of a first example (A), a second example (B), and a third example (C) of a second monitor for dimensional control, respectively, to be used in the manufacturing method of a semiconductor device in Embodiment 1 of the invention.
Figure 8B:
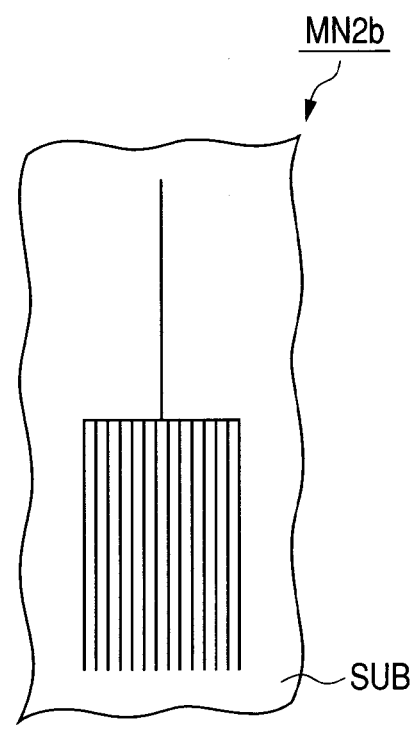
Figure 8C:
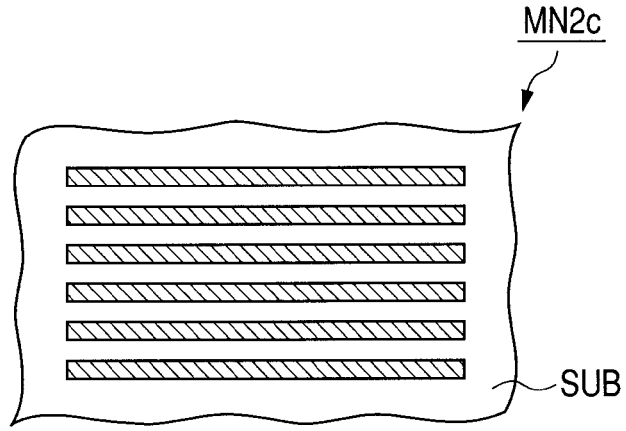
Figure 9:
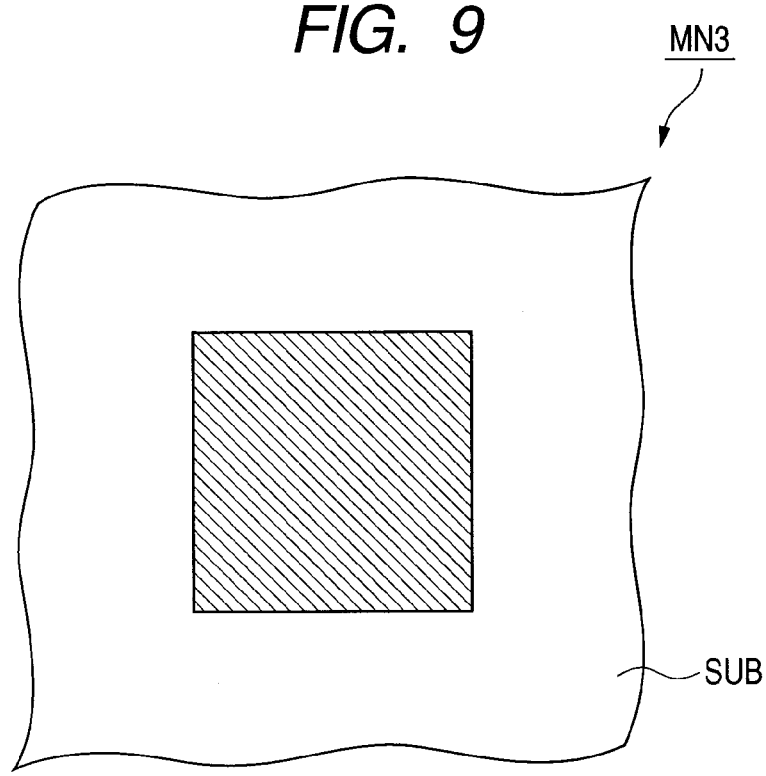
FIG. 9 is a plan view schematically illustrating the configuration of a first example of a third monitor for film-thickness measurement to be used in the manufacturing method of a semiconductor device in Embodiment 1 of the invention.

In the first region RA, at least one monitor selected from a first monitor, second monitors MN2a, MN2b, and MN2c (FIGS. 8(A), 8(B), and 8(C)) and a third monitor MN3 (FIG. 9) is placed.

The first monitor is a monitor for electrically evaluating at least either one of an active element (transistor or the like) and a passive element (resistor, capacitor, or the like) formed in the internal circuit region CT, which will be described in detail later. The second monitors MN2a, MN2b, and MN2c (FIGS. 8(A), 8(B), and 8(C)) are monitors for dimensional control of a circuit formed in the internal circuit region CT. The dimensional control is effected by measuring the dimension with, for example, an electron microscope. The third monitor MN3 (FIG. 9) is a monitor for measuring the thickness of a thin film formed in the internal circuit region CT. The film thickness is measured by, for example, an optical method.

Figure 7A:
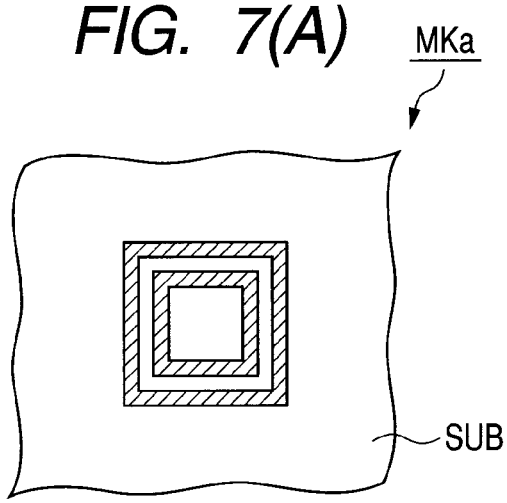
FIG. 7(A), FIG. 7(B), and FIG. 7(C) are plan views schematically illustrating the configurations of a first example (A), a second example (B), and a third example (C) of an alignment mark for lithography, respectively, to be used in the manufacturing method of a semiconductor device in Embodiment 1 of the invention.
Figure 7B:
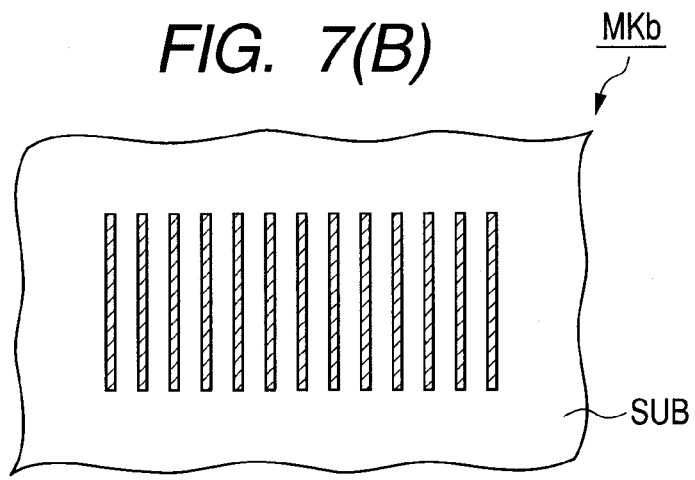
Figure 7C:
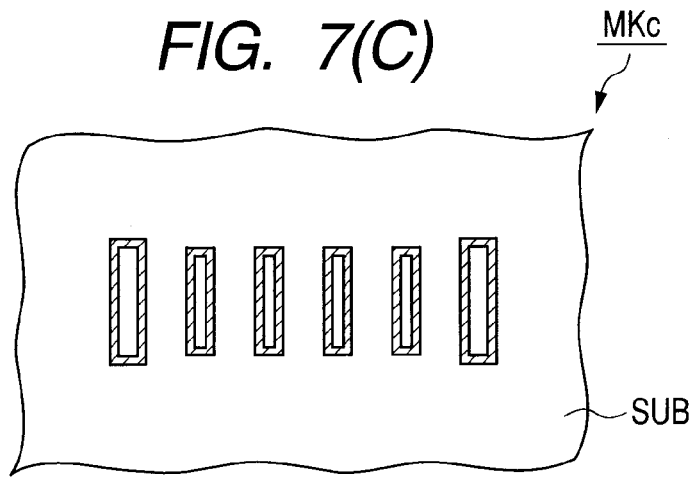

In the second region RB, alignment marks MKa, MKb, and MKc for lithography (FIGS. 7(A), 7(B), and 7(C)) are placed as the alignment mark MK for lithography (FIG. 1). The alignment mark MKa for lithography is a mark for overlay inspection in the photolithography step, while alignment marks MKb and MKc for lithography are alignment marks for a stepper.

Next, a portion of the first scribe region SCa (FIG. 4) of the first semiconductor wafer FWa along the scribe line SL (FIG. 6) is cut off by scribing (cutting step) with a dicer. By this, the plural the first semiconductor chip regions CRa is cut into individual first semiconductor chips Cha (FIG. 1).

The scribe line SL is positioned along the first line LA. The width of a region to be cut off with the dicer is almost equal to or a little greater than the width of the first region. During scribing, the first region RA (FIG. 6) located along the first line LA is cut off so that the first region RA does not remain in the first semiconductor chip CHa (FIG. 1). On the contrary, at least a portion of the second region RB is located along the second line LB which is not cut off so that it remains in the first semiconductor chip CHa. The remaining of this second region RB will next be described in further detail.

Prior to the scribing of the first semiconductor wafer WFa (FIG. 4), at least a portion of the second region RB (FIG. 6) is placed between a position which will be a first chip end face CE1 (FIG. 2) and the first side S1 in a planar view. The second region RB has, in a planar view (FIG. 2), a long side LS parallel to the first side S1 and a short side SS perpendicular to the first side S1. In scribing, either one of an operation of cutting a portion of the second region RB in a direction perpendicular to the long side LS or an operation by which the second region RB is not cut off at all is performed. By this operation, at least a portion of the second region RB remains in the first semiconductor chip CHa.

In FIG. 6, the scribe line SL indicated by a long dashed short dashed line is for the first scribe region SCa formed by one shot corresponding to FIG. 6, while the scribe line SL indicated by a long dashed double-short dashed line is for the first scribe region SCa (not illustrated) formed by another shot adjacent to the above-described shot.

Figure 10:
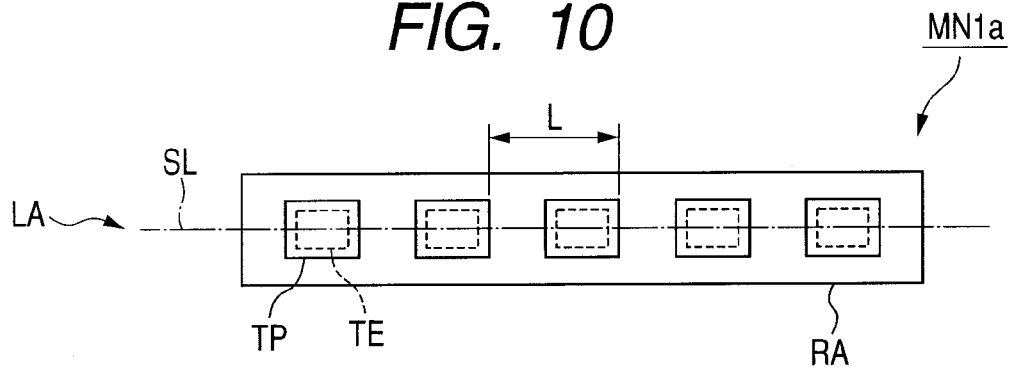
FIG. 10 is a plan view schematically illustrating the configuration of a first example of a first monitor for electrical evaluation of at least either one of an active element and a passive element to be used in the manufacturing method of a semiconductor device in Embodiment 1 of the invention.
Figure 11:
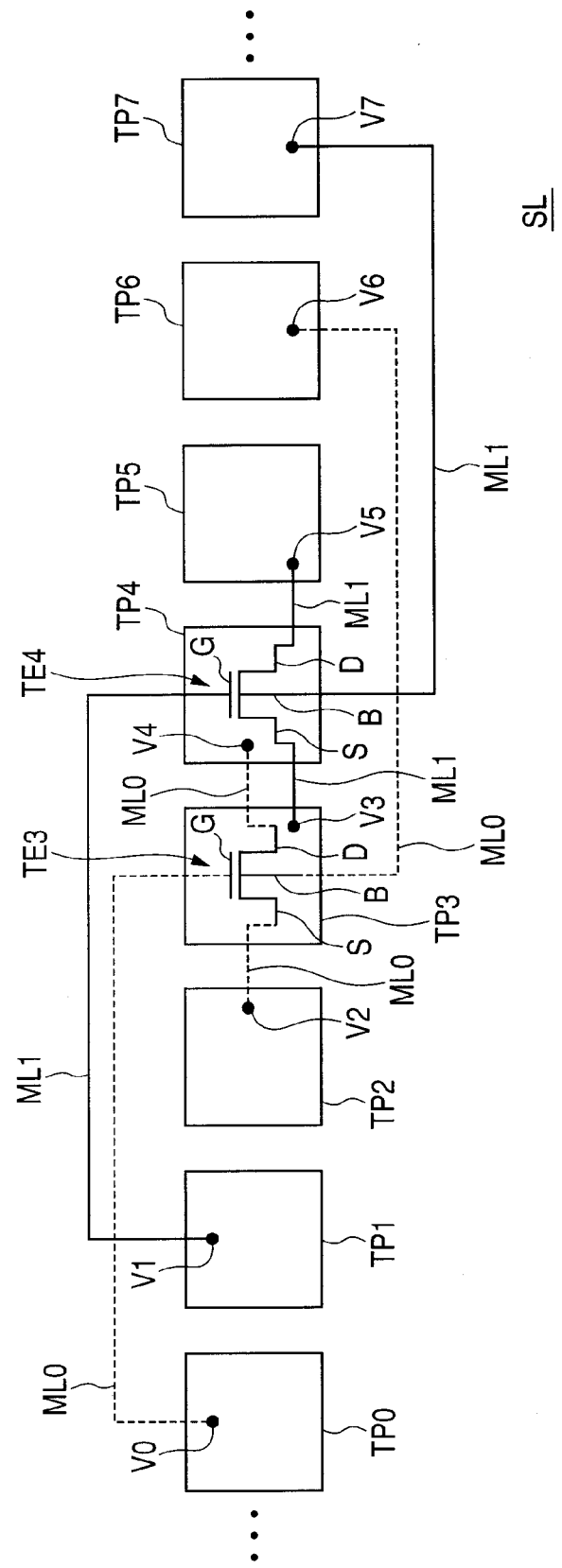
FIG. 11 is a view schematically illustrating the layout of TEG in Embodiment 1 of the invention.

Next, the first monitor will be described in detail. When referred to FIGS. 10 and 11, a first monitor MN1a is for electrically evaluating at least either one of an active element (such as transistor) and a passive element (such as resistor or capacitor) formed in the internal circuit region CT and it is a kind of TEG (test element group). The first monitor MN1a is placed in the first region RA and has a plurality of test elements TE and a plurality of test electrode pads TP. As the test electrode pad TP, test electrode pads TP0 to TP7 are arranged in a line. These test electrode pads TP0 to TP7 have therebelow a test element TE. In FIG. 11, test elements TE3 and TE4 formed in regions immediately below the test pads TP3 and TP4, respectively, are illustrated as a typical example. As the test elements TE3 and TE4, a MOS transistor (insulating gate field effect transistor) is used by way of example. The MOS transistor is a four-terminal element and has a source terminal S, a drain terminal D, a control gate terminal G, and a back gate terminal B.

In the test element TE3, the control gate terminal G is electrically coupled to the test electrode pad TP0 through a first metal interconnect ML0 and a via V0, the source terminal S is coupled to the test electrode pad TP2 adjacent to the test element TE3 through the first metal interconnect ML0 and a via V2, the drain terminal D is electrically coupled to the test electrode pad TP4 adjacent to the test element TE3 through the first metal interconnect ML0 and a via V4, and a back gate terminal B is electrically coupled to the test electrode pad TP6 through the first metal interconnect ML0 and a via V6.

In the test element TE4, the control gate terminal G is electrically coupled to the test electrode pad TP1 through a second metal interconnect ML1 and a via V1, the source terminal S is coupled to the test electrode pad TP3 adjacent to the test element TE4 through the second metal interconnect ML1 and a via V3, the drain terminal D is electrically coupled to the test electrode pad TP5 adjacent to the test element TE4 through the second metal interconnect ML1 and a via V5, and the back gate terminal B is electrically coupled to the test electrode pad TP7 via the second metal interconnect ML1 and a via V7.

The metal interconnects ML0 and ML1 are interconnects of different interconnect levels. For example, the first metal interconnect ML0 is an interconnect of a first-level metal interconnect layer and the second metal interconnect is an interconnect of a second-level metal interconnect layer lying thereover.

As illustrated in FIG. 11, one test element TE (TE3 or TE4) is coupled to electrode pads adjacent thereto and also to electrode pads next but one to these electrode pads. Accordingly, the test element TE is electrically coupled to, in a test electrode pad line, an even-numbered test electrode pad group or an odd-numbered test electrode pad group.

The first metal interconnect ML0 and the second metal interconnect ML1 are interconnects of different interconnect levels. By electrically coupling a test electrode pad and a test element TE which are adjacent to each other by using interconnects of different interconnect levels, electrical coupling between them can be achieved without causing collision of these interconnects.

Figure 12:
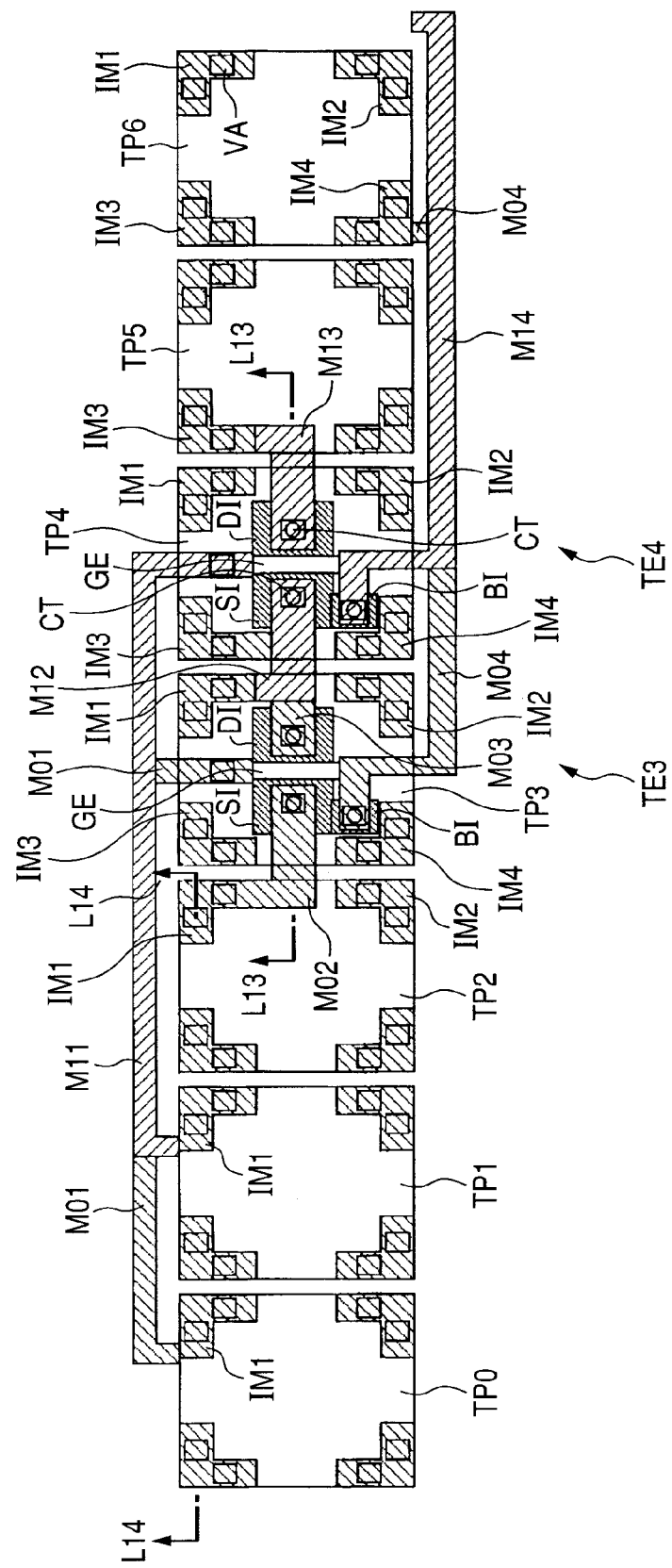
FIG. 12 is a view schematically illustrating a planar layout of the TEG in Embodiment 1 of the invention.

Referring to FIG. 12, the test electrode pads TP0 to TP6 are placed. For each of these test electrode pads TP0 to TP6, first-level island-like metal portions IM1 to IM4 are placed as an intermediate interconnect for contact. These first-level island-like metal portions IM1 to IM4 are separated from each other and interconnects can be made to pass through them.

The first-level island-like metal portions IM1 to IM4 are formed in a step similar to a manufacturing step of an interconnect of the first-level metal interconnect layer to be used for a semiconductor device formed over the semiconductor chip. In each of the test electrode pads, the island-like metal portions are provided for each interconnect layer over the semiconductor chip. FIG. 12 typically illustrates island-like metal portions formed in the first-level metal interconnect layer.

Vias VAs are formed for each of the island-like metal portions IM1 to IM4. The vias VAs include both a through-hole and a conductive material to be filled therein. This enables coupling of an interconnect placed in one interconnect layer to an island-like metal portion and further coupling of it to the uppermost-level test electrode pad through the island-like metal portion of a next higher level. These first-level island-like metal portions are similarly placed in each test electrode pad. Accordingly, the first island-like metal portions at the same position in the respective test electrode pads are denoted with the same reference symbol.

The test elements TE3 and TE4 are each a four-terminal transistor (MOS transistor) as illustrated in FIG. 11. The four-terminal transistor is formed in an active region over a semiconductor substrate region. This active region contains a source impurity region SI, a drain impurity region DI, and an impurity region (back gate impurity region) BI for extracting a back gate electrode. These impurity regions SI, DI, and BI are low-resistance regions. Through the back gate impurity region BI, a bias voltage is supplied to a substrate region (back gate) in which a transistor is to be formed.

A gate electrode GE is formed between the source impurity region SI and the drain impurity region DI. The source terminal S, the drain terminal D, and the back gate terminal B are comprised of the impurity regions SI, DI, and BI and contacts CT corresponding thereto, respectively.

The gate electrode GE is formed of polysilicon lying below the metal interconnects and is electrically coupled to a corresponding gate electrode interconnect (metal interconnect) through the via VIA formed in the gate electrode extraction region.

In the test element TE3, the gate electrode GE is electrically coupled to the first-level metal interconnect M01 through the via VA. The first-level metal interconnect M01 to which the gate electrode interconnect GE is coupled is electrically coupled to the island-like metal portion IM1 of the test electrode pad TP0, passing through a region between the island-like metal portions IM1 and IM3 provided for the test electrode pad TP3 and at the same time extending along the test electrode pads TP1 and TP2. This island-like metal portion IM1 and the first-level metal interconnect M01 are formed in the same-level interconnect layer. The source impurity region SI is electrically coupled to a first-level metal interconnect M02 through a contact CT. This first-level metal interconnect M02 is electrically coupled to the island-like metal portion IM1 of the test electrode pad TP2, passing through a region between the island-like metal portions IM3 and IM4 of the test electrode pad TP3 and extending between the island-like metal portions IM1 and IM2 of the test electrode pad TP2. The drain impurity region DI is electrically coupled to a first-level metal interconnect M03 through a via. This first-level metal interconnect M03 passes between the first-level island-like metal portions IM1 and IM2 disposed for the test electrode pad TP3 and is electrically coupled to the first-level island-like metal portion IM3 disposed for the test electrode pad TP4 adjacent to the test electrode pad TP3.

The back gate impurity region BI of the test element TE3 is electrically coupled to a first-level metal interconnect M04 through a contact. This first-level metal interconnect M04 is electrically coupled to the first-level island-like metal portion IM4 disposed for the test electrode pad TP6, passing between the first-level island-like metal portions IM2 and IM4 disposed for the test electrode pad TP3 and extending along the test electrode pads TP4 and TP5.

The gate electrode GE of the test element TE4 is electrically coupled to a second-level metal interconnect M11 through a via (tungsten plug). This second-level metal interconnect M11 is electrically coupled to a second-level island-like metal portion provided above the first-level island-like metal portion IM1 of the test electrode pad TP1, passing through a region between the first-level island-like metal portions IM1 and IM3 (that is, the second-level island-like metal portions) provided for the test electrode pad TP4 and extending from the test electrode pad TP3 to TP2.

The source impurity region SI is electrically coupled to a second-level metal interconnect M12 through a via (tungsten plug). This second-level metal interconnect M12 passes through a region between island-like metal portions IM3 and IM4 (that is, between the second-level island-like metal portions) provided for the test electrode pad TP4 and is electrically coupled to an island-like metal portion provided above the island-like metal portion IM1 provided for the test electrode pad TP3 adjacent to the test electrode pad TP4. Also in this FIG. 12, the second-level island-like metal portion made of a second-level metal interconnect is not illustrated.

The drain impurity region DI is electrically coupled to a second-level metal interconnect M13 through a via (tungsten plug). This second-level metal interconnect M13 passes through a region between the first-level island-like metal portions IM1 and IM2 (that is, between the second-level island-like metal portions) provided for the test electrode pad TP4 and is electrically coupled to a second-level island-like metal portion provided above the island-like metal portion IM3 of the test electrode pad TP5 adjacent to the test electrode pad TP4.

The back gate impurity region BI is electrically coupled to a second-level metal interconnect M14 through a via (tungsten plug). This second-level metal interconnect M14 is electrically coupled to the second-level island-like metal portion (disposed corresponding to the first-level island-like metal portion IM4) of the test electrode pad TP7 illustrated in FIG. 11 through the test electrode pads TP5 and TP6, passing between the island-like metal portions IM2 and IM4 (between second-level island-like metal portions) provided for the test electrode pad TP4.

As illustrated in FIG. 12, the first-level metal interconnects M01 to M04 are utilized as the first-metal interconnect ML1 illustrated in FIG. 11 and the second-level metal interconnects M11 to M14 are utilized as the second metal interconnect ML1. The first-level metal interconnect and second-level metal interconnect are interconnects in different interconnect layers and terminals of each test element can be electrically coupled to a corresponding test electrode pad immediately thereabove and test electrode pads next but one to the electrode without causing collision of interconnects.

The metal portions of an intermediate interconnect layer of the test electrode pad are in island form so that they are separated from each other and configure an interconnect passage region. This enables electrical coupling of a test element near a region immediately below a test electrode pad to a test electrode pad adjacent thereto without causing collision with the metal portions of the former test electrode pad.

Figure 13:
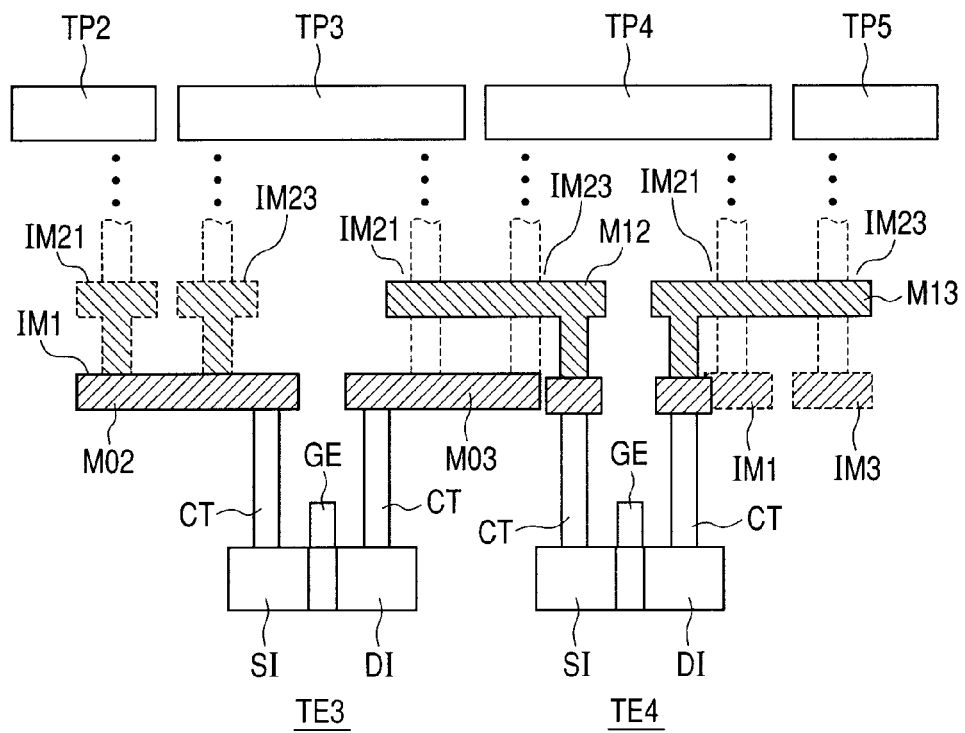
FIG. 13 is a view schematically illustrating the cross-sectional structure taken along a line L13-L13 illustrated in FIG. 12.

Referring to FIG. 13, the island-like metal portions composed of the first-level metal interconnect and those composed of the second-level metal interconnect are shown. These island-like metal portions do not appear in the cross-sectional structure taken along a line L13-L13 so that these island-like metal portions are shown with a dashed line in FIG. 13.

In the test element TE3, the source impurity region SI and the drain impurity region DI are electrically coupled to the first-level metal interconnects M02 and M03, respectively, through contacts CT. The first-level metal interconnect M02 is electrically coupled to the first-level island-like metal portion IM1 provided for the test electrode pad TP2.

The first-level island-like metal portion IM1 is electrically coupled to a second-level island-like metal portion IM21 made of a second-level metal interconnect. For the test electrode pad TP3, a second-level island-like metal portion IM23 is provided adjacent to this second-level island-like metal portion IM21. The first-level metal interconnect M03 is electrically coupled to the second-level island-like metal portion IM23 through the first-level island-like metal portion IM3 provided for the test electrode pad TP4.

In the test element TE4, the source impurity region SI and the drain impurity region DI are electrically coupled to first-level intermediate interconnects through contact holes, respectively. These intermediate interconnects are electrically coupled to the second-level metal interconnects M12 and M13 through a via (plug). The second-level metal interconnect M12 is electrically coupled to the second-level island-like metal portion IM21 provided for the test electrode pad TP3 and the second-level metal interconnect M13 is electrically coupled to the second-level island-like metal portion IM23 provided for the test electrode pad TP5. These second-level island-like metal portions IM21 and IM23 are electrically coupled to the first-level island-like metal portions IM1 and IM3, respectively.

As the metal interconnect, a copper interconnect is employed. The interconnects and plugs (filled in the vias) are formed by the damascene process. The contact CT is conventionally formed with a tungsten plug. The uppermost-level test electrode pad is made of an aluminum interconnect. Metal interconnects lower than the uppermost-level test electrode pad TP but above the gate electrode are all formed with a copper interconnect.

Figure 14:
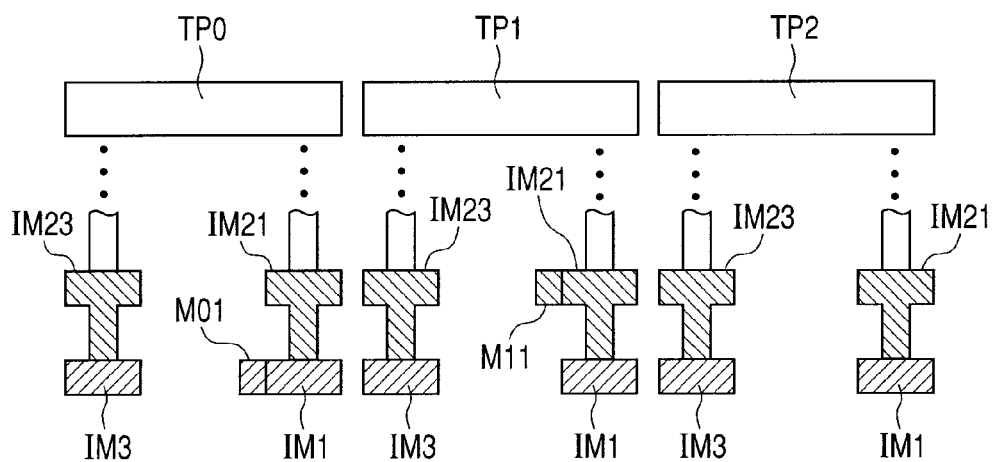
FIG. 14 is a view schematically illustrating the cross-sectional structure taken along a line L14-L14 illustrated in FIG. 12.

Referring to FIG. 14, the island-like metal portion IM1 provided for the test electrode pad TP0 is electrically coupled to the first-level metal interconnect M01. The second-level island-like metal portion IM21 provided for the test electrode pad TP1 is electrically coupled to the second-level metal interconnect M11. Thus, electrical coupling of the gate electrode of the test element TE3 and the gate electrode of the test element TE4 is performed using interconnects in different layers.

No interconnects are coupled to the island-like metal portions IM3, IM23, IM1 and IM21 provided for the test electrode pad TP3 in the layout shown in FIG. 12.

The island-like metal portions provided for the respective test electrode pads are electrically coupled to their corresponding test electrode pads through vias (plugs). Thus, the test elements TE3 and TE4 can each be electrically coupled to the test electrode pads adjacent thereto and the test electrode pads next but one to these adjacent test electrode pads.

Incidentally, metal interconnects (copper interconnects) located in and above the second-level interconnect layers and the vias located therebelow are formed using the damascene process, and the formation of interconnects and the filling of the vias are conducted simultaneously.

Figure 15:
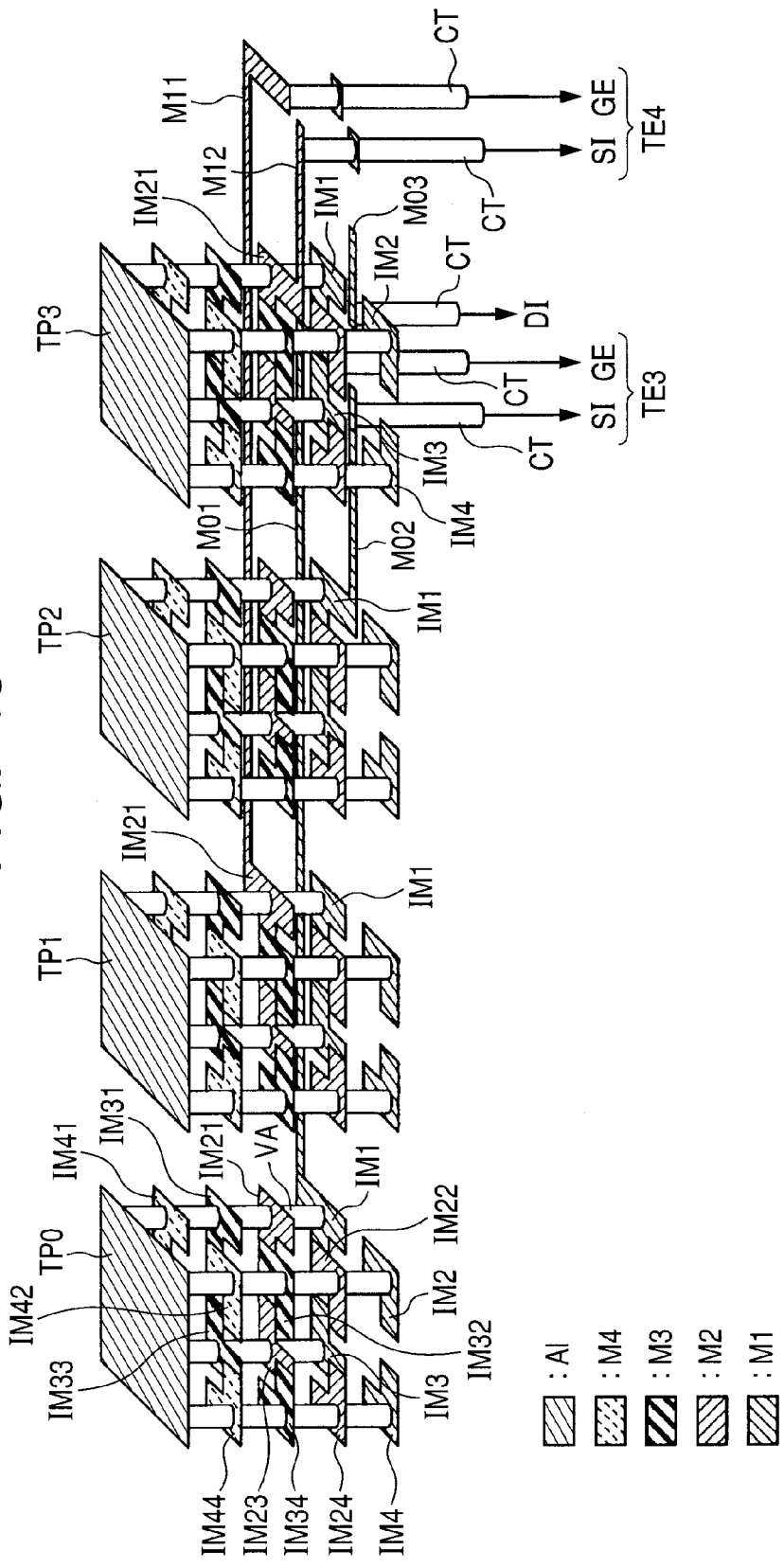
FIG. 15 is a perspective view of the TEG illustrated in FIG. 12.

Referring to FIG. 15, the structure of the test electrode pads TP0 to TP3 is illustrated. In FIG. 15, portions corresponding to the configuring elements shown in FIG. 12 are indicated with the same reference numerals.

The test electrode pads TP0 to TP3 are formed of an uppermost-level aluminum interconnect. These test electrode pads TP0 to TP3 are provided with island-like metal portions according to the interconnection of the metal interconnect layers formed over individual semiconductor chips. FIG. 15 shows, as one example, a five-layer metal interconnect structure having four copper interconnect layers and the uppermost-level aluminum interconnect. In this structure, the test electrode pads are similar in the layout of the island-like metal portions. In a certain test electrode pad TP (one of TP0 to TP3), first-level, second-level, third-level, and fourth-level island-like metal portions IM1, IM21, IM31, and IM41 arranged in a height direction are electrically coupled to one another through a via VA and are further electrically coupled to the corresponding test electrode pad TP. Likewise, first-level, second-level, third-level, and fourth-level island-like metal portions IM2, IM22, IM32, and IM42 arranged in a height direction are electrically coupled to one another through a via VA and are further electrically coupled to the corresponding test electrode pad TP. Island-like metal portions IM3, IM23, IM33, and IM43 arranged in a height direction are coupled to one another through a via VA and are further electrically coupled to the corresponding test electrode pad TP. Likewise as well, island-like metal portions IM4, IM24, IM34, and IM44 arranged in a height direction are electrically coupled to one another through a via VA and are further electrically coupled to the corresponding test electrode pad TP.

With regard to the test elements TE3 and TE4, electrical couplings of contacts CT to the source impurity region SI and the gate electrode GE are typically shown. The source impurity region SI of the test element TE3 is electrically coupled to the first-level metal interconnect M02 through the contact CT. The first-level metal interconnect M02 passes through a region between the first-level island-like metal portions IM3 and IM4 of the corresponding test electrode pad TP3 and is electrically coupled to the first-level island-like metal portion IM1 of the test electrode pad TP2 adjacent thereto. The gate electrode GE of each test element TE is electrically coupled to the first-level metal interconnect M01 through the contact CT. The first-level metal interconnect M01 passes through a region between the first-level island-like metal portions IM3 and IM1 of the corresponding test electrode pad TP3, passes through the outside of the test electrode pads TP2 and TP1, and is electrically coupled to the first-level island-like metal portion IM1 of the test electrode pad TP0.

The source impurity region SI of the test element TE4 is electrically coupled to the second-level metal interconnect M12 through a contact CT, an intermediate interconnect, and a via (plug). The second-level metal interconnect M12 is electrically coupled to the second-level island-like metal portion IM21 of the test electrode pad TP3. The gate electrode GE is electrically coupled to the second-level metal interconnect M11 through a contact CT, an intermediate interconnect, and a via. The second-level metal interconnect M11 is located so as to extend outside beyond the test electrode pads TP3 and TP2 and is electrically coupled to the second-level island-like metal portion IM21 of the test electrode pad TP1.

In the test elements TE3 and TE4 as shown in FIG. 15, the metal interconnects are provided so as to pass through a gap region between the island-like metal portions of their corresponding test electrode pads. The metal interconnects are electrically coupled to the same-level island-like metal portions of the test electrode pads adjacent thereto or those of the test electrode pads next but one to the adjacent electrode pads. Thus, they are electrically coupled to the test electrode pads adjacent thereto.

By disposing the metal portions in island form (in L-shaped form) in the test electrode pad of the uppermost layer, the terminals of each test element can be electrically coupled to the test electrode pad adjacent thereto while preventing collisions of interconnect, even if the test elements are arranged in alignment with each test electrode pad. It is also possible to place interconnects for electrodes/terminals while preventing collision of the interconnects by using, for test elements adjacent to each other, the interconnects in different interconnect layers.

Incidentally, in FIG. 15, four-layered metal interconnects used for the interconnection between a test element and a test electrode pad, and the interconnects are each electrically coupled to the island-like metal portion of the same layer. The number of layers of the island-like metal portions provided for the test electrode pad is however determined depending on the number of interconnect layers employed in a semiconductor device closely disposed on a semiconductor chips.

Referring to FIGS. 16 to 19, the manufacturing process of the test element TE and the test electrode pad TP will next be described.

Figure 16:
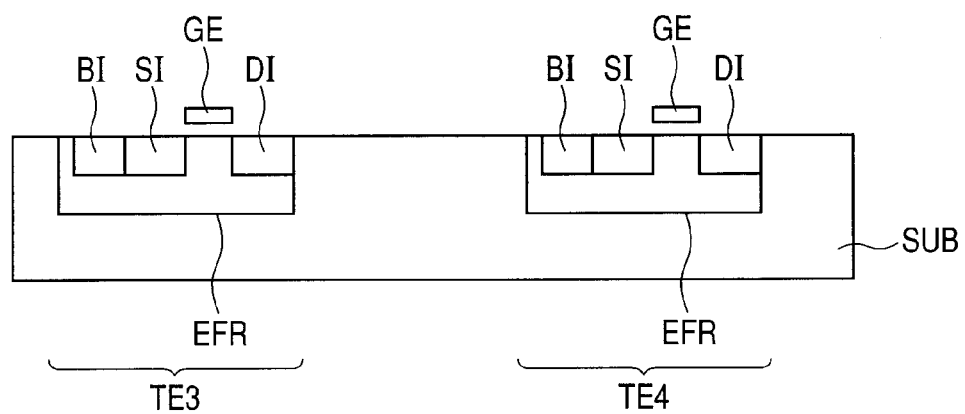
FIG. 16 is a view illustrating a manufacturing step of the TEG in Embodiment 1 of the invention.

As shown in FIG. 16, element formation regions EFR corresponding to regions in which test electrode pads are to be placed are first formed over a semiconductor substrate SUB in a shunt region (scribe region) in which shunt lines (scribe lines) are to be formed. When test elements TE3 and TE4 are MOS transistors as described above, the element formation regions EFR are used as back gate regions. A source impurity region SI, a drain impurity region DI, and a back gate impurity region BI are formed as active regions in the surface of each of the element formation regions EFR. The back gate impurity region BI and the element formation region EFR have the same conductivity type and a back gate bias is applied to the element formation region EFR via the back gate impurity region BI. The source impurity region SI and the drain impurity region DI have a conductivity type different from that of the element formation region EFR.

Then, a gate electrode GE is formed between the source impurity region SI and the drain impurity region DI through a gate insulating film not illustrated in the drawing.

Figure 17:
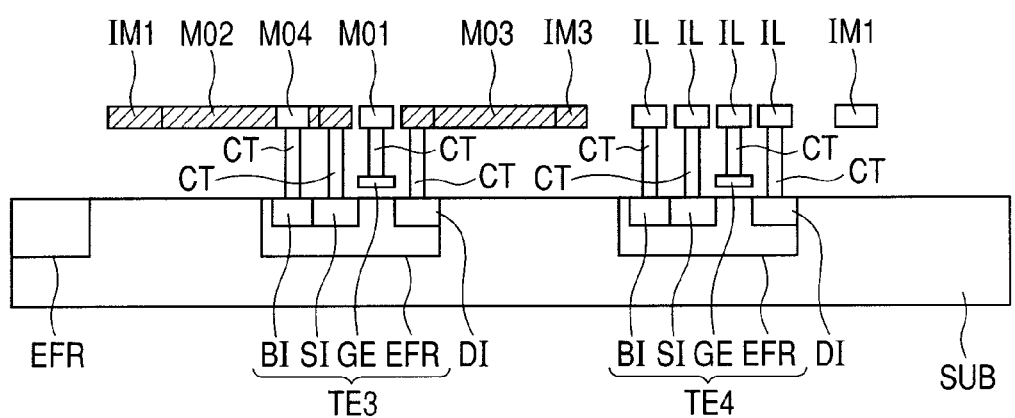
FIG. 17 is a view illustrating a manufacturing step of the TEG in Embodiment 1 of the invention.

Next, as shown in FIG. 17, electrode interconnects are formed for the test elements TE3 and TE4. Contacts CT comprised of, for example, a tungsten plug are formed for the drain impurity region DI, the source impurity region SI, and the back gate impurity region BI respectively. A contact CT is also formed for the gate electrode GE. Thereafter, first-level metal interconnects in a predetermined pattern are formed. In the test element TE3, a contact CT coupled to the source impurity region SI is electrically coupled to the first-level island-like metal portion IM1 formed in a test electrode pad adjacent thereto through a first-level metal interconnects M0. Likewise, a contact CT provided for the drain impurity region DI is also electrically coupled to the first-level island-like metal portion IM3 provided in the adjacent test electrode pad through the first-level metal interconnect M03. Further, contacts CT provided for the gate electrode GE and the back gate impurity region BI are electrically coupled to the first-level metal interconnects M01 and M04, respectively.

In the test element TE4, intermediate interconnects IL formed from first-level metal interconnects are formed for their contacts CT. Upon formation of the first-level metal interconnects, couplings to island-like metal portions to be provided for other test electrode pads are not performed on the test element TE4.

Figure 18:
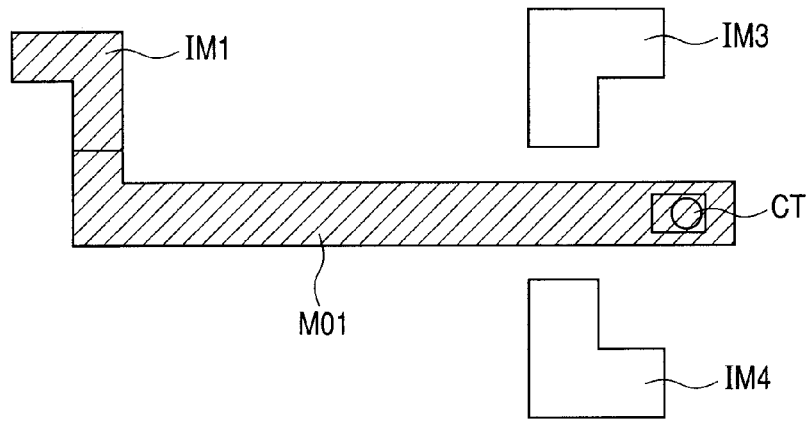
FIG. 18 is a view illustrating one example of the layout of an interconnect in the manufacturing step of the TEG in Embodiment 1 of the invention.

Interconnection of the first-level metal interconnects of the test element TE3 shown in FIG. 17 is conducted in the following manner. Described specifically, as shown in FIG. 18, a first-level metal interconnect M01 passing between first-level island-like metal portions IM3 and IM4 provided for the corresponding test electrode pad is disposed and electrically coupled to a first-level island-like metal portion IM1 of a test electrode pad adjacent thereto. Thus, even when the test element corresponding to the test electrode pad is disposed, the electrode interconnect of the test element can be electrically coupled to island-like metal portions of the test electrode pad adjacent thereto without causing collision of the island-like metal portions of these test electrode pads. Other drain electrode interconnects, back gate electrode extraction interconnects, and gate electrode interconnects are also disposed so as to pass through a region between the corresponding island-like metal portions adjacent to each other.

Figure 19:
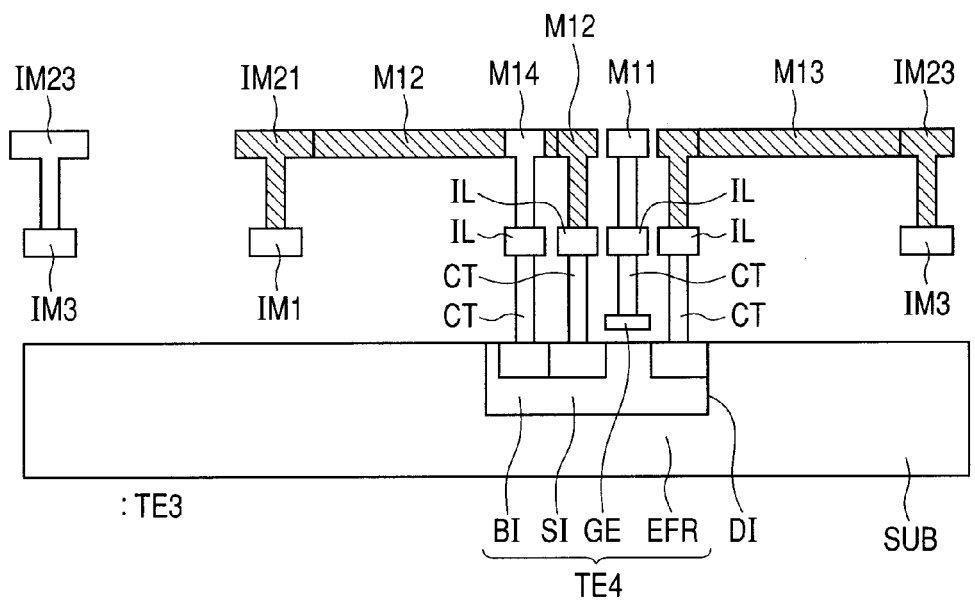
FIG. 19 is a view illustrating a manufacturing step of the TEG in Embodiment 1 of the invention.

Next, as shown in FIG. 19, second-level metal interconnects in predetermined patterns are formed. In the test element TE4 in this step, second-level metal interconnects are electrically coupled to intermediate interconnects IL provided for contacts CT lying therebelow. Described specifically, the source impurity region SI is electrically coupled to island-like metal portions IM1 and IM21 provided for an adjacent test electrode pad through the corresponding contact CT, intermediate interconnect IL, and second-level metal interconnect M12. The drain impurity region DI is electrically coupled to the second-level island-like metal portion IM23 provided in the adjacent test electrode pad by the second-level metal interconnect M13 and is further electrically coupled to the first-level island-like metal portion IM3 therebelow. Second-level metal interconnects M11 and M14 are formed for the gate electrode GE and the back gate impurity region BI, respectively, and are electrically coupled to the second-level island-like metal portions provided in the corresponding test electrode pads.

Even upon formation of electrical coupling using the second-level metal interconnects, as shown in FIG. 18, the second-level metal interconnects pass between the second-level island-like metal portions provided for the corresponding test electrode pads so that the test element can be electrically coupled to test electrode pads adjacent thereto while avoiding collision of interconnects.

Then, island-like metal portions are formed from metal interconnects (copper interconnects) for respective upper layers in the same step as that for interconnects of elements of a semiconductor device over each semiconductor chip. In the final formation step of the metal interconnects, test electrode pads TP are formed as an uppermost metal interconnect by using an aluminum interconnect, whereby the TEG illustrated in from FIG. 12 to FIG. 15 is formed.

The manufacture of the test elements, island-like metal portions, and test electrode pads illustrated in from FIG. 16 to FIG. 18 is performed in the same step as that employed for the formation and interconnection of the elements of the semiconductor device formed over each semiconductor chip.

Figure 20:
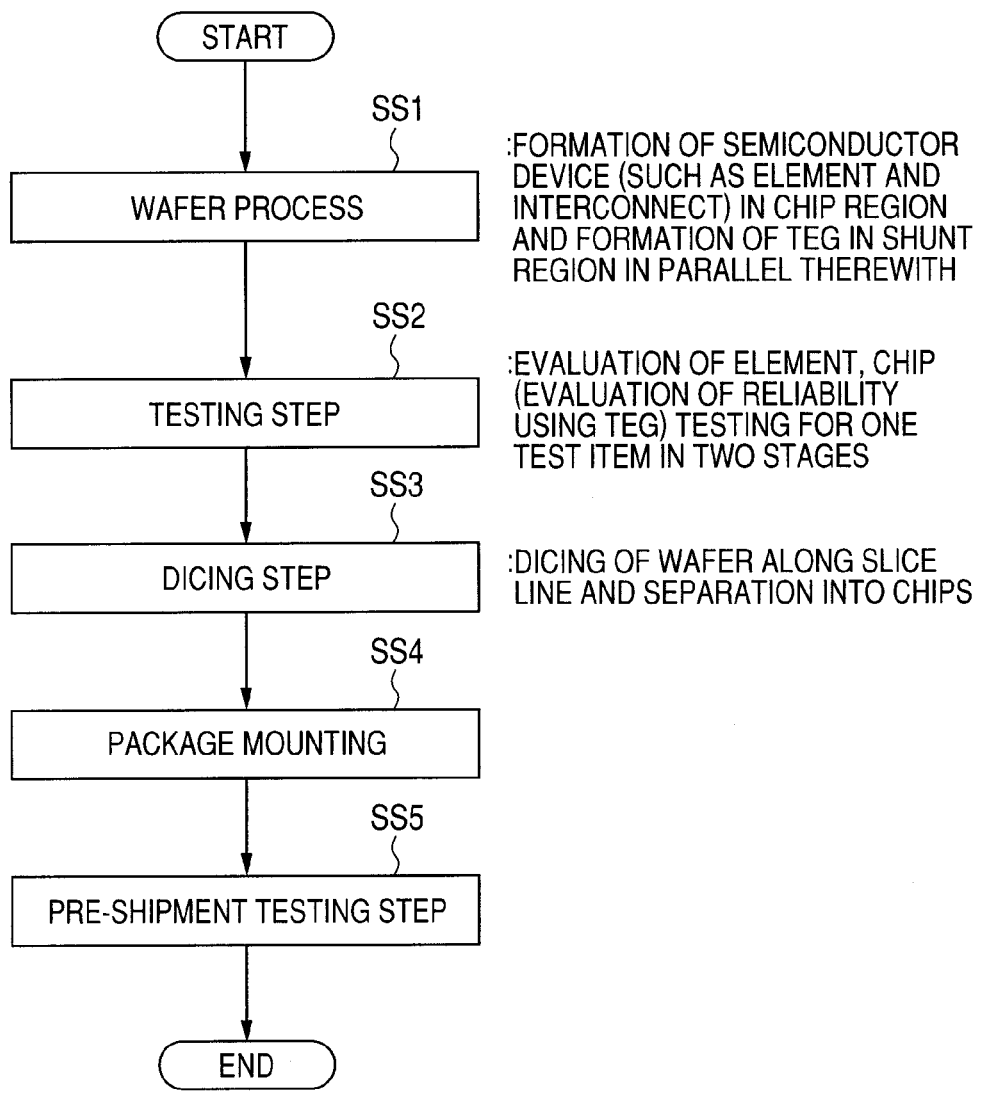
FIG. 20 is a flow chart showing the manufacturing steps of a semiconductor device in Embodiment 1 of the invention.

Referring to FIG. 20, manufacturing steps of the semiconductor device of the present embodiment will next be described briefly.

A wafer process is performed (Step SS1) and a desired target semiconductor device is formed in each chip region over a semiconductor wafer. In parallel with the manufacture of elements and interconnects of the semiconductor device, a TEG is formed in a region of a slice line.

Figure 21:
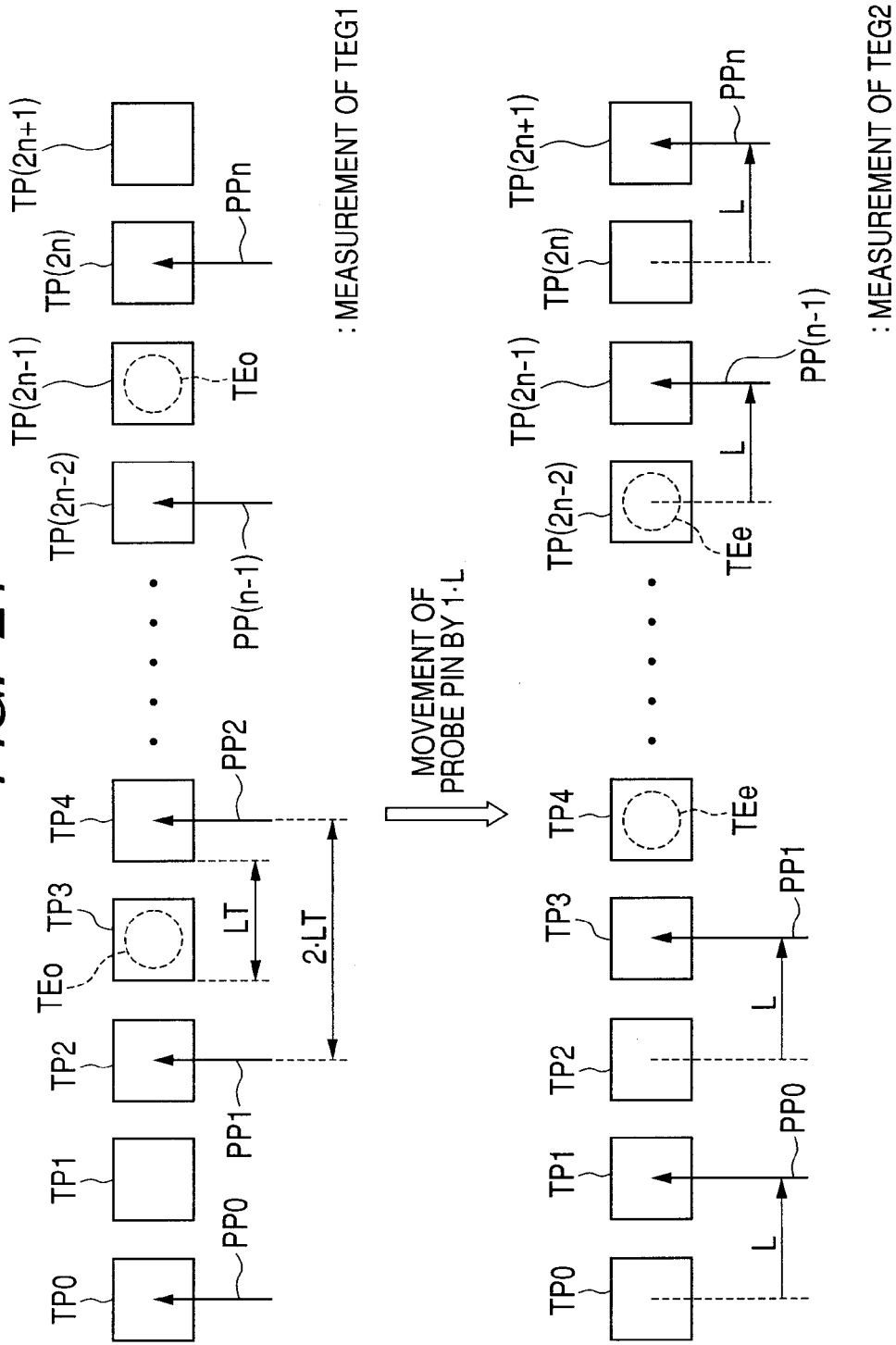
FIG. 21 is a view schematically illustrating the layout of a probe pin and a test electrode pad during the testing step shown in FIG. 20.

When the wafer process is completed, a wafer-level test is performed (Step SS2). In the test step, elements and semiconductor chips are evaluated. In addition, reliability evaluations corresponding to various control items such as threshold voltage and transconductance of an MOS transistor and the like are executed using the TEG. In the test step using this TEG, one test item is tested in two stages as shown in FIG. 21. The test step using the TEG will next be described referring to FIG. 21.

Assume that test electrode pads TP0 to TP(2n+1) are arranged as a TEG as illustrated in the upper column of FIG. 21. During this test step, probe pins PP0 to PPn (which will hereinafter be called "probe pin PP", collectively) are brought into contact with the even-numbered test electrode pads TP0, TP2, . . . TP(2n). The test probe pins PP0 to PPn are arranged at a pitch of 2·LT whereas the test electrode pads TP0 to TP(2n+1) are arranged at a pitch of 1·LT. As one example, the pitch of the pads is 60 μm and the pitch of the probe pins is 120 μm. A test is carried out by bringing the probe pins PP0 to PPn into contact with the even-numbered test electrode pads TP0 to TP(2n) serving as a TEG1. In this case, the test is conducted on test elements TEo placed below the odd-numbered test electrode pads TP3 to TP(2n−1). Measurements on the test elements can therefore made without causing an influence of the contact of the probe pins on the elements to be tested. When the test element is a MOS transistor, the test item is, for example, a threshold voltage Vth or transconductance gm. After completion of the test by bringing the probe pins PP0 to PPn into contact with the even-numbered test electrode pads TP0 to TP(2n), the probe pins are moved by 1·LT. As a result, the probe pins PP0 to PPn are shifted by one electrode pad pitch, i.e., ½ of the probe pin pitch as illustrated in the lower column of FIG. 21 so that the probe pins PP0 to PPn are brought into contact with the odd-numbered test electrode pads TP1 to TP(2n+1). In this state, the measurement of TEG is carried out. In this case, tests on the test elements TEe placed below the even-numbered test pads TP4, . . . TP(2n−2) as the test elements TE are carried out.

Thus, the test element groups TEG1 and TEG2 are successively tested for test control items of this semiconductor chip, whereby the test on all the TEGs provided for this semiconductor chip is completed. Since a large number of elements are provided as TEG, semiconductor chips can be evaluated for many control items. This makes it possible to accurately determine whether the semiconductor device is good or bad and as a result, a high reliability semiconductor device can be obtained.

In this wafer-level test, circuit characteristics of the semiconductor device formed over each semiconductor chip and failure of its circuit operation are also evaluated using the pads over the semiconductor chip.

Referring back to FIG. 12, when the wafer-level test step in Step SS2 is completed, dicing is performed along the slice lines on the semiconductor wafer to separate it into individual first semiconductor chips CHa (FIG. 1) (Step SS3).

The non-defective semiconductor chips identified by the wafer-level test step, among the individual first semiconductor chips CHa, are each mounted in a package (Step SS4). After the package mounting, a final pre-shipment test (for example, burn-in test) is conducted (Step SS5) and final non-defective products are shipped.

A manufacturing method of a second semiconductor chip CHb (FIG. 3) will next be described. First, a second semiconductor wafer WFb is formed with reference to FIGS. 22 and 23. Described specifically, the second semiconductor wafer WFb is formed by forming a plurality of second semiconductor chip regions CRb and second scribe regions SCb over a semiconductor substrate SUB by using photolithography.

The second scribe region SCb is sandwiched between two second semiconductor chip regions CRb adjacent to each other and has a width SWb. The width SWb is wide enough to place a single line LO therein and at the same time smaller than the width SWa (FIG. 5). Along this line LO, a first region RA and a second region RB are placed. In the second scribe region SCb sandwiched between the second semiconductor chip regions CRb adjacent to each other, the first region RA and the second region RB are arranged in one line.

Figure 22:
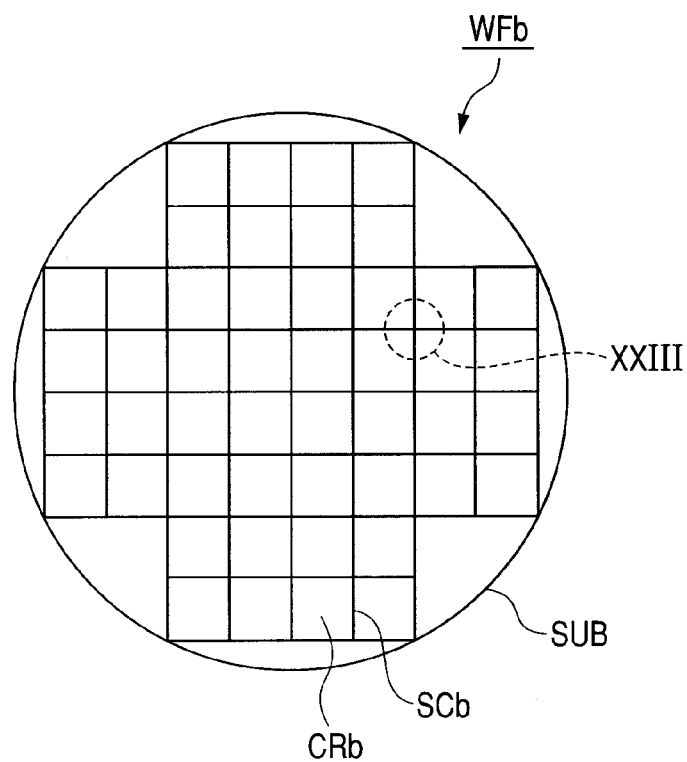
FIG. 22 is a plan view schematically illustrating the configuration of a second semiconductor wafer formed according to the manufacturing method of a semiconductor device in Embodiment 1 of the invention.
Figure 23:
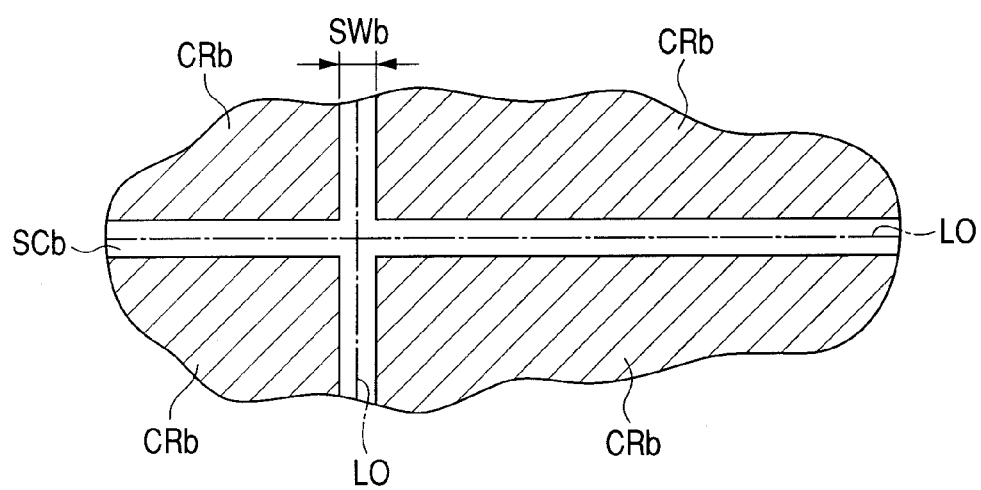
FIG. 23 is an enlarged view of a dashed line portion XXIII of FIG. 22.

In the photolithography of this embodiment, four (=2×2) second semiconductor chip regions CRb illustrated in FIG. 22 are exposed by one shot. The desired number of the second semiconductor chip regions CRb are exposed over the second semiconductor wafer WFb by carrying out a plurality of shots while partially overlapping the peripheral portions thereof.

Figure 24:
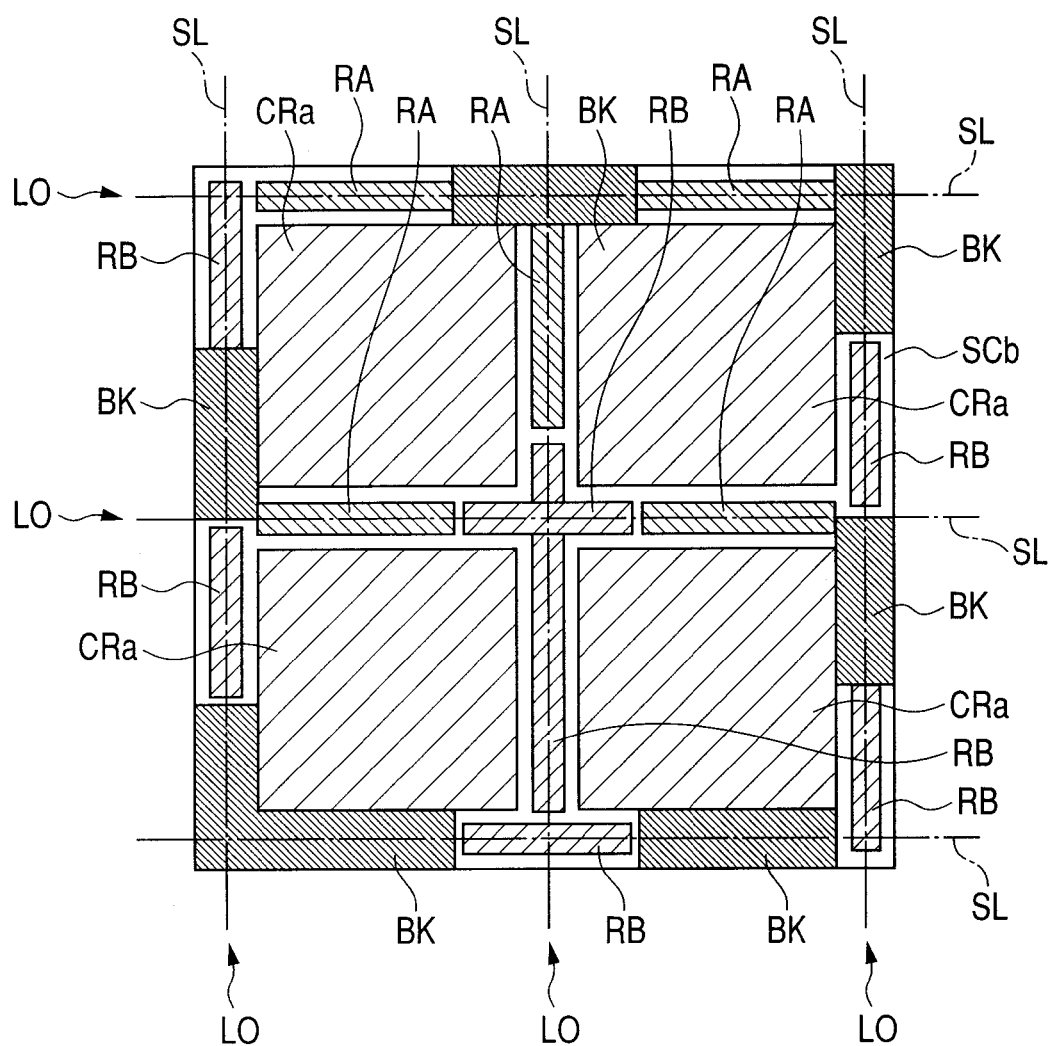
FIG. 24 is a view illustrating a region corresponding to one shot in FIG. 22.

Referring mainly to FIG. 24, a region of the second semiconductor wafer WFb corresponding to one shot of photolithography is shown more specifically. The first region RA and the second region RB are arranged in series in a portion of the second scribe region SCb sandwiched between the two second semiconductor chip regions CRb adjacent to each other.

Incidentally, a blank region BK is a region which is not exposed by the shot in the photolithography step but is exposed by another shot performed adjacent to the above shot. For example, in a blank region BK located right above in FIG. 24, a region similar to the second scribe region SCb located left above and including the second region RB is formed. In the blank region located right below, a region similar to the second scribe region SCb located right above and including the first region RA is formed.

Next, scribing is performed with a dicer similar to that employed in scribing of the first semiconductor wafer WFa (FIG. 4). By this scribing, a portion of the second scribe region SCb (FIG. 22) of the second semiconductor wafer WFb along the scribe line SL (FIG. 24) is cut off and the plural second semiconductor chip regions CRb are cut into individual second semiconductor chips CHb (FIG. 3).

The scribe line SL is positioned along the line LO. The width of the region cut off with the dicer is almost the same level with the width of the first region RA so that the first regions RA (FIG. 24) arranged along the line LO are removed by cutting. As a result, no first region remains in the second semiconductor chip CHb (FIG. 3). The second region RB is also cut off and removed, together with the first region RA.

According to the present embodiment, as illustrated in FIG. 6, the first region RA and the second region RB are arranged in parallel to each other in a portion of the first scribe region SCa. This means that the first region RA and the second region RB are arranged as a plurality of lines LP running in parallel with the first scribe region SCa. This makes it possible to provide a larger number of alignment marks for lithography and PCMs.

Along the scribe line SL positioned along the first line LA, scribing is performed at a width almost similar to that of the first region RA. The first region RA arranged in only the first line LA is cut off and therefore removed so that the first monitor MN1a, the second monitors MN2a to MN2c, and third monitor MN3 are all removed. It is therefore possible to prevent information leakage from at least any one of these monitors.

Supposing that both the first line LA and the second line LB are cut off from the first semiconductor wafer WFa by scribing, the first region RA can be disposed freely in both of the first line LA and the second line LB. In this case, however, the dicer should be widened in order to cut off both the first line LA and the second line LB. In this case, the width SWb (FIG. 23) of the second semiconductor wafer WFb should be made equal to or greater than the wide width of the dicer. This increases a proportion of the second scribe region SCb in the second semiconductor wafer WFb, inevitably resulting in a decrease in the number of the second semiconductor chips CHb available from one second semiconductor wafer WFb.

In the present embodiment, on the other hand, the width of the dicer is determined so as to leave the second line LB. Compared with dicing of both the first line LA and the second line LB as described above, the width of the dicer can be decreased. This makes it possible to decrease the width SWb (FIG. 23) of the second semiconductor wafer WFb, leading to suppression of the proportion of the second scribe region SCb in the second semiconductor wafer WFb. This results in an increase in the number of the second semiconductor chips CHb available from one second semiconductor wafer WFb.

In the present embodiment, the test elements TE are each arranged in a region immediately below the corresponding electrode pad TP and the test element TE is electrically coupled to test electrode pads TP adjacent to the test electrode pad TP immediately above the test element TE and test electrode pads TP next but one to these adjacent electrode pads. The pitch of the probe pins PP is twice as wide as that of the test electrode pads TP so that a number of test patterns can be measured by making use of the conventional probe card.

Further, test elements TE are disposed below the test electrode pads TP, respectively. Compared with the configuration in which test elements TE are placed in a region between test electrode pads TP, the number of test elements TE can therefore be increased without widening the area. As a result, it is possible to make a test while placing test elements TE corresponding to many test control items. Upon test, a probe pin PP is not brought into contact with the test electrode pad TP immediately above the test element TE to be measured so that accurate measurement can be carried out without causing an adverse effect such as stress on the test element TE to be tested. (Embodiment 2) When referred to FIG. 25, a first semiconductor chip CHc formed by a manufacturing method of a semiconductor device according to the present embodiment has test electrode pads TP instead of some of the alignment marks MK for lithography in a portion of the region of the first semiconductor chip Cha (FIG. 1) of Embodiment 1 in which the alignment marks MK for lithography has been formed.

Figure 26:
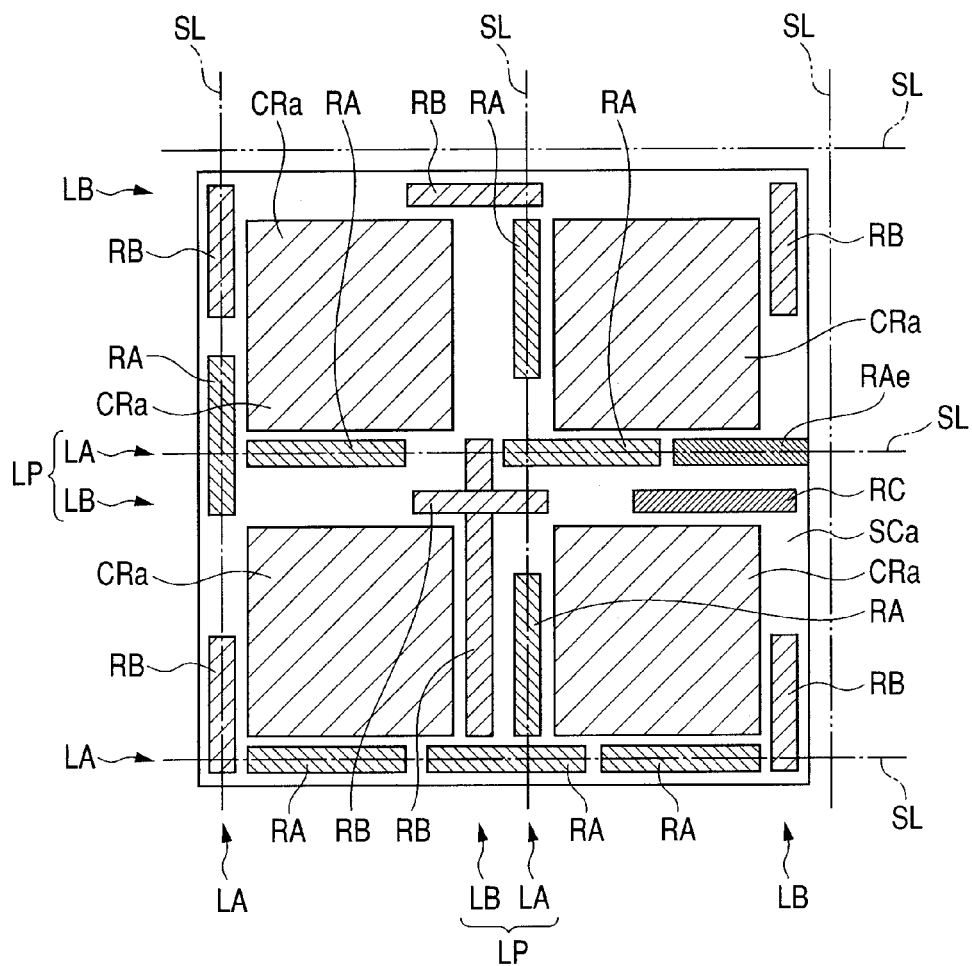
FIG. 26 is a view illustrating a region corresponding to one shot of a first semiconductor wafer formed according to the manufacturing method of a semiconductor device in Embodiment 2 of the invention.

Referring to FIG. 26, a region corresponding to one shot in photolithography in a wafer level in the present embodiment is shown. First regions RA and RAe are placed along a first line LA, while a second region RB and a third region RC are placed along a second line LB. In other words, in a portion of a first scribe region SCa sandwiched between two first semiconductor chip regions CRa adjacent to each other, the first region RA and the second region RB are placed in parallel to each other and in another portion of the first scribe region SCa, the first region RAe and the third region RC are placed in parallel to each other.

Figure 27:
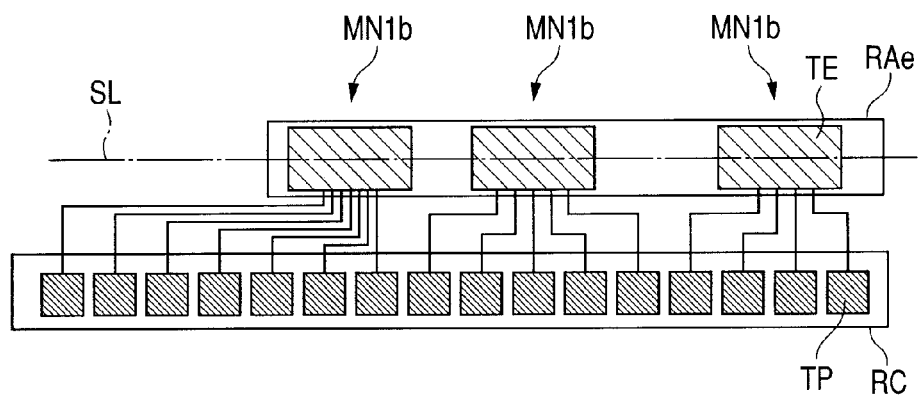
FIG. 27 is a view schematically illustrating the configuration of a second example of a first monitor for electrical evaluation of at least either one of an active element and a passive element and a pad for measuring electrical properties of the first monitor, each used in the manufacturing method of a semiconductor device in Embodiment 2 of the invention.

When referred to FIG. 27, the test elements TE are placed in the first region RAe and the test electrode pads TP are placed in the third region RC. The test elements TE are similar to those in Embodiment 1 and correspond to first monitors MN1$b$ for electrically evaluating at least either one of an active element (such as transistor) and a passive element (such as resistor or capacitor). Accordingly, in a portion of the first scribe region SCa sandwiched between the first semiconductor chip regions CRa, the third region RC is placed in parallel to the first monitors MN1$b$. The test electrode pads TP are similar to those in Embodiment 1 and serve to measure the electrical characteristics of the first monitors MN1$b$.

Figure 25:
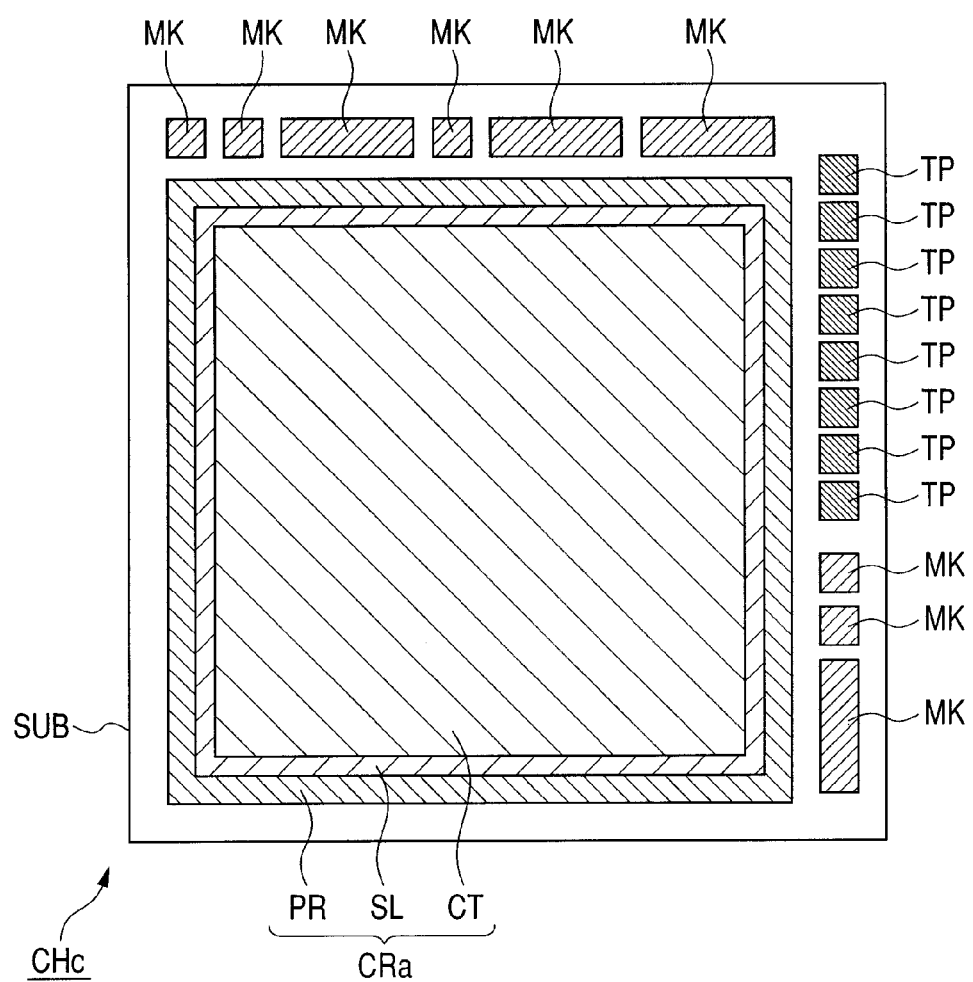
FIG. 25 is a plan view schematically illustrating the configuration of a first semiconductor chip formed according to a manufacturing method of a semiconductor device in Embodiment 2 of the invention.

By scribing with a dicer, a portion along the scribe line SL (FIGS. 26 and 27) is cut off. As a result, a plurality of the first semiconductor chip regions CRa are cut into individual first semiconductor chips CHc (FIG. 25).

The scribe line SL is positioned along the first line LA. The width of a region to be cut off with the dicer is made almost equal to that of the width of each of the first regions RA and RAe. During scribing, the first regions RA and RAe arranged along the first line LA are cut off and removed. As a result, neither the first region RA nor RAe (FIG. 26) remains in the first semiconductor chip CHc (FIG. 25). On the contrary, at least a portion of each of the second region RB and the third region RC is placed along the second line LB which is not cut off so that it remains on the first semiconductor chip CHc.

In FIG. 26, the scribe line SL indicated by a long dashed short dashed line is for the first scribe region SCa formed by one shot corresponding to FIG. 6, while the scribe line SL indicated by a long dashed double-short dashed line is for the first scribe region SCa (not illustrated) formed by another shot adjacent to the above-described shot.

The configuration not described above is almost similar to that of Embodiment 1 so that same or corresponding elements will be identified by the same symbols and overlapping descriptions will be omitted.

Figure 28:
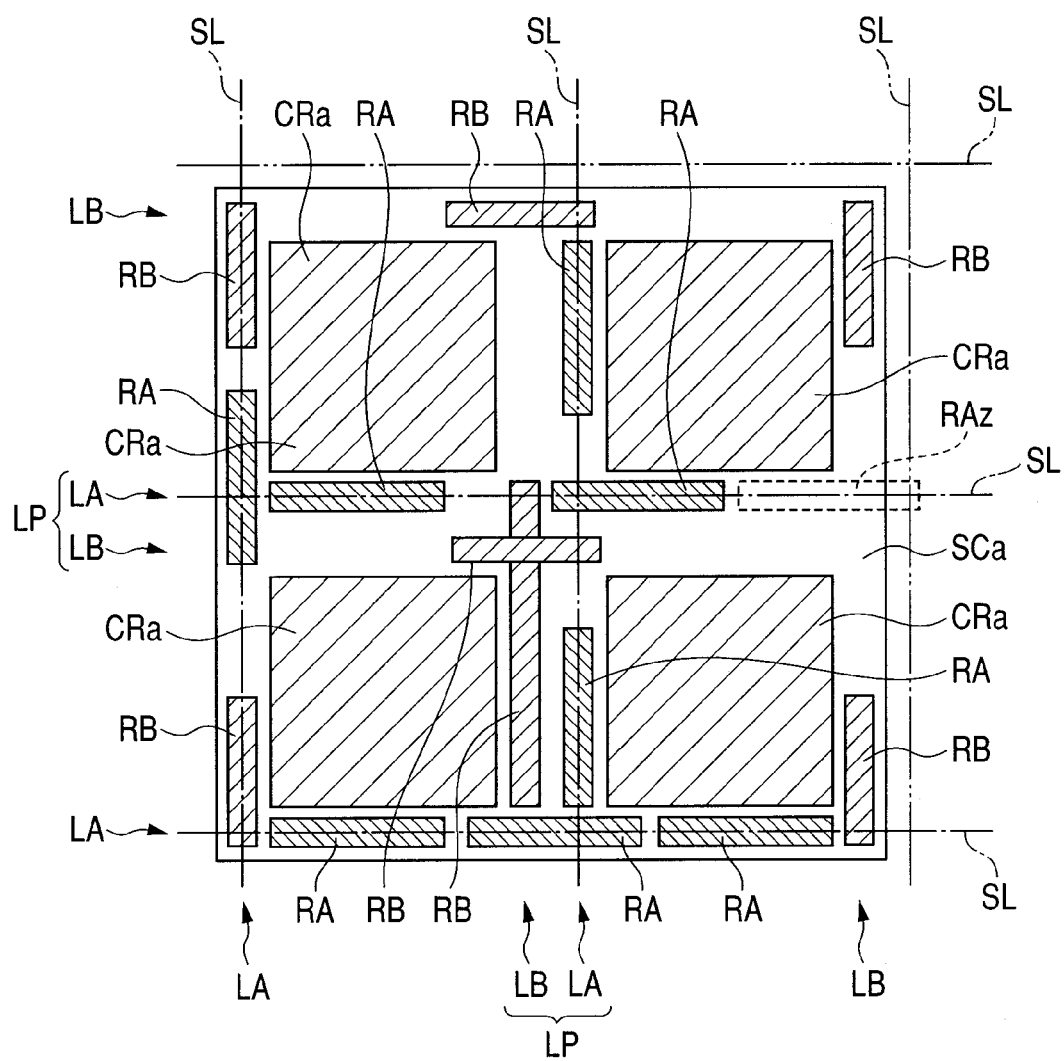
FIG. 28 is a view illustrating a region corresponding to one shot of a first semiconductor wafer formed by a manufacturing method of a semiconductor device in Comparative Example.

Referring to FIG. 28, a region corresponding to one shot in photolithography in a wafer level in the comparative example is shown. A fourth region RAz is a region which becomes necessary when test electrode pads TP and test elements TE in FIG. 27 are formed on the first line LA. In this case, not only the test elements TE but also the test electrode pads TP should be formed on the first line LA so that the fourth region RA becomes greater than the first region RAe of the present embodiment. As a result, the fourth region RA cannot be placed in a region of one shot, making it impossible to form the fourth region RA.

According to the present embodiment, on the other hand, the test electrode pads TP (FIG. 27) are placed in the third region RC (FIG. 27) so that it is not necessary to dispose pads in the first region RAe (FIGS. 26 and 27). This makes it possible to decrease the area of the first region RAe. Compared with the comparative example, the place for the first monitor MN1$b$ can be secured on the first line LA more easily.

Incidentally, in the present embodiment, all the test electrode pads TP are placed in the third region RC, but some of the test electrode pads TP may be placed in the first region RAe.

Figure 29:
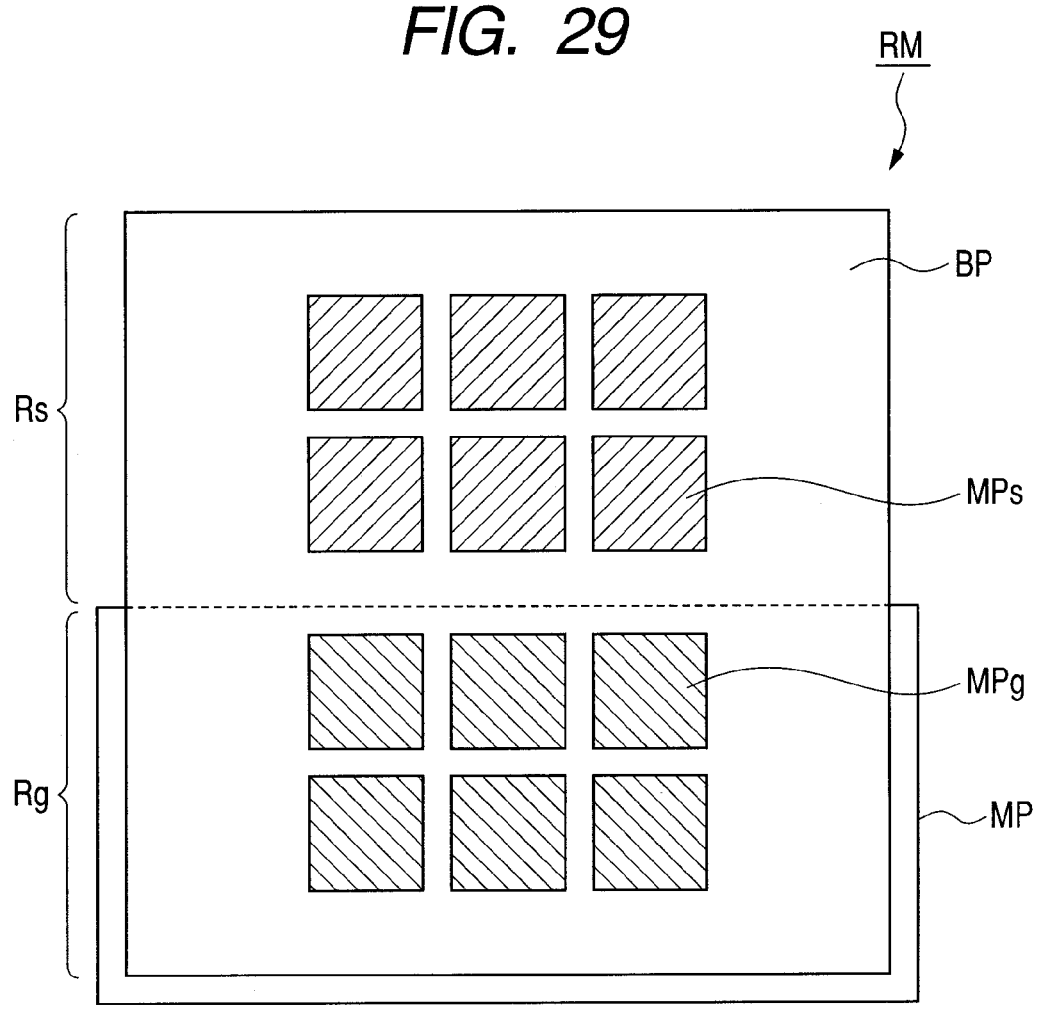
FIG. 29 is a plan view schematically illustrating the configuration of a multilayer mask to be used in a manufacturing method of a semiconductor device in Embodiment 3 of the invention.

(Embodiment 3) When referred to FIG. 29, a multilayer musk RM is used in a photolithography step for forming a first semiconductor wafer WFa (FIG. 4) in the present embodiment. The term "multilayer mask" as used herein means a photomask on which a plurality of patterns to be used in a plurality of steps, respectively, are drawn. Using a multilayer mask makes it possible to decrease the total number of masks used in the photolithography step performed several times in the manufacturing step so that the cost for the mask can be reduced.

The multilayer mask RM of the present embodiment has, over a mask blanks BP, an STI region Rs in which patterns MPs of STI (shallow trench isolation) corresponding to 6 chips have been formed and a gate region Rg in which patterns MPg of a transistor corresponding to 6 chips have been formed. For example, when photolithography for STI is performed, the gate region Rg is shielded from light by a light shielding portion MP.

Figure 30:
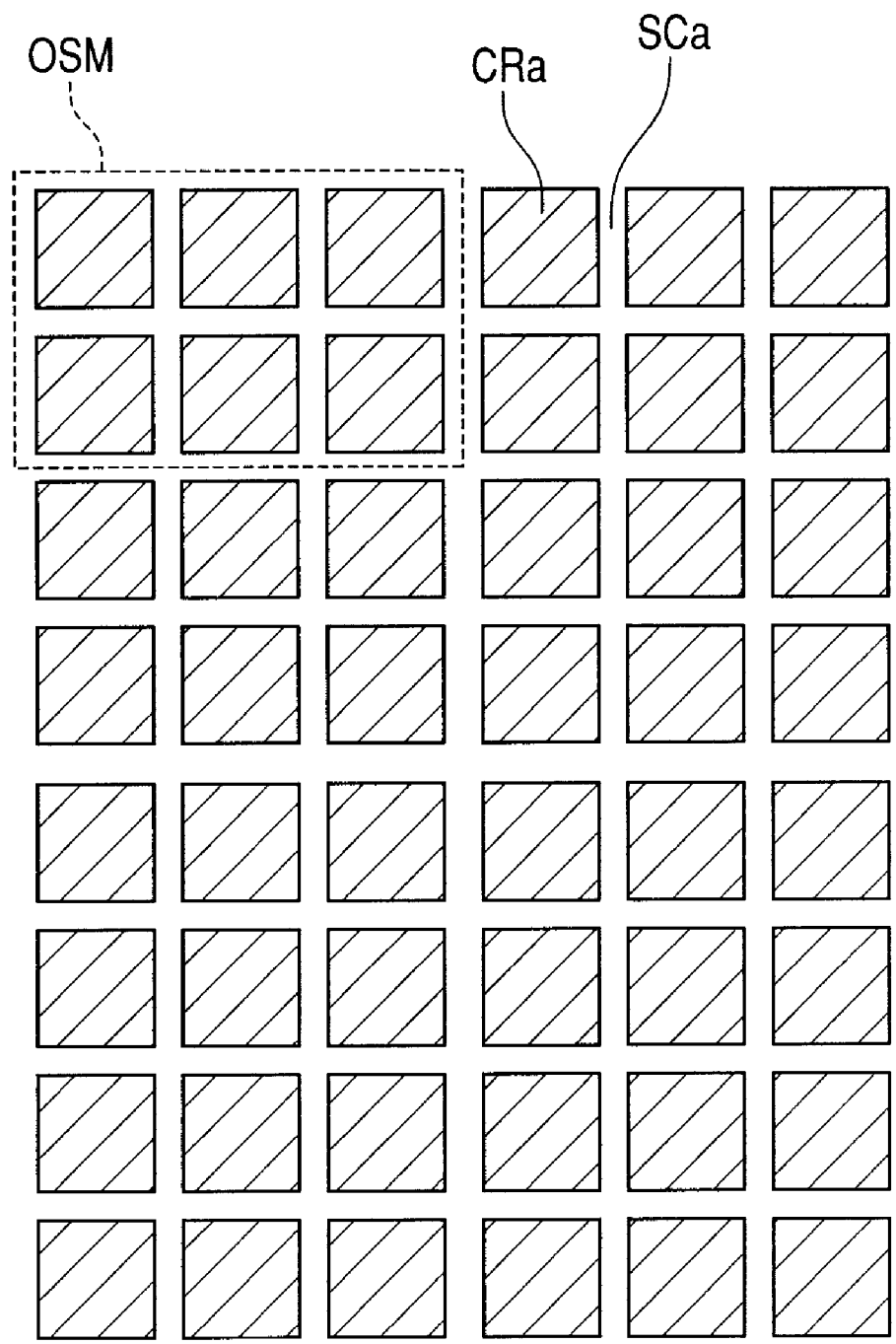
FIG. 30 is a plan view schematically illustrating a pattern of a first semiconductor wafer formed using the mask of FIG. 29.

Referring FIG. 30, photolithography using the multilayer mask RM is carried out with a shot region OSM including six first semiconductor chip regions CRa as one shot.

The configuration not described above is almost similar to that of Embodiment 1 so that the same or corresponding elements will be identified by the same symbols and overlapping descriptions will be omitted.

Figure 31:
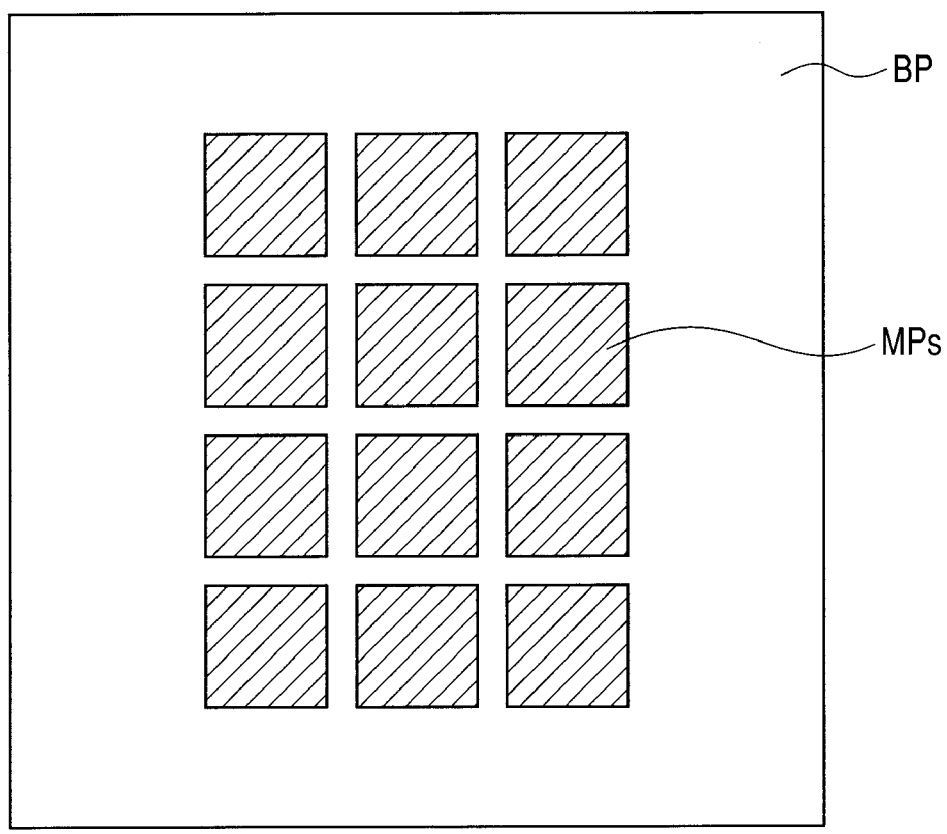
FIG. 31 is a plan view schematically illustrating the configuration of a conventional mask.

A comparative example of the present embodiment will next be described. In FIG. 31, a mask RS is not a multilayer mask but a conventional one. It has an area as large as that of the multilayer mask RM. Only patterns MPs are formed in the mask RS and the number of them is greater than that of the patterns MPs of the multilayer mask RM. In the comparative example of the present embodiment, the mask has MPs corresponding to 12 chips.

Figure 32:
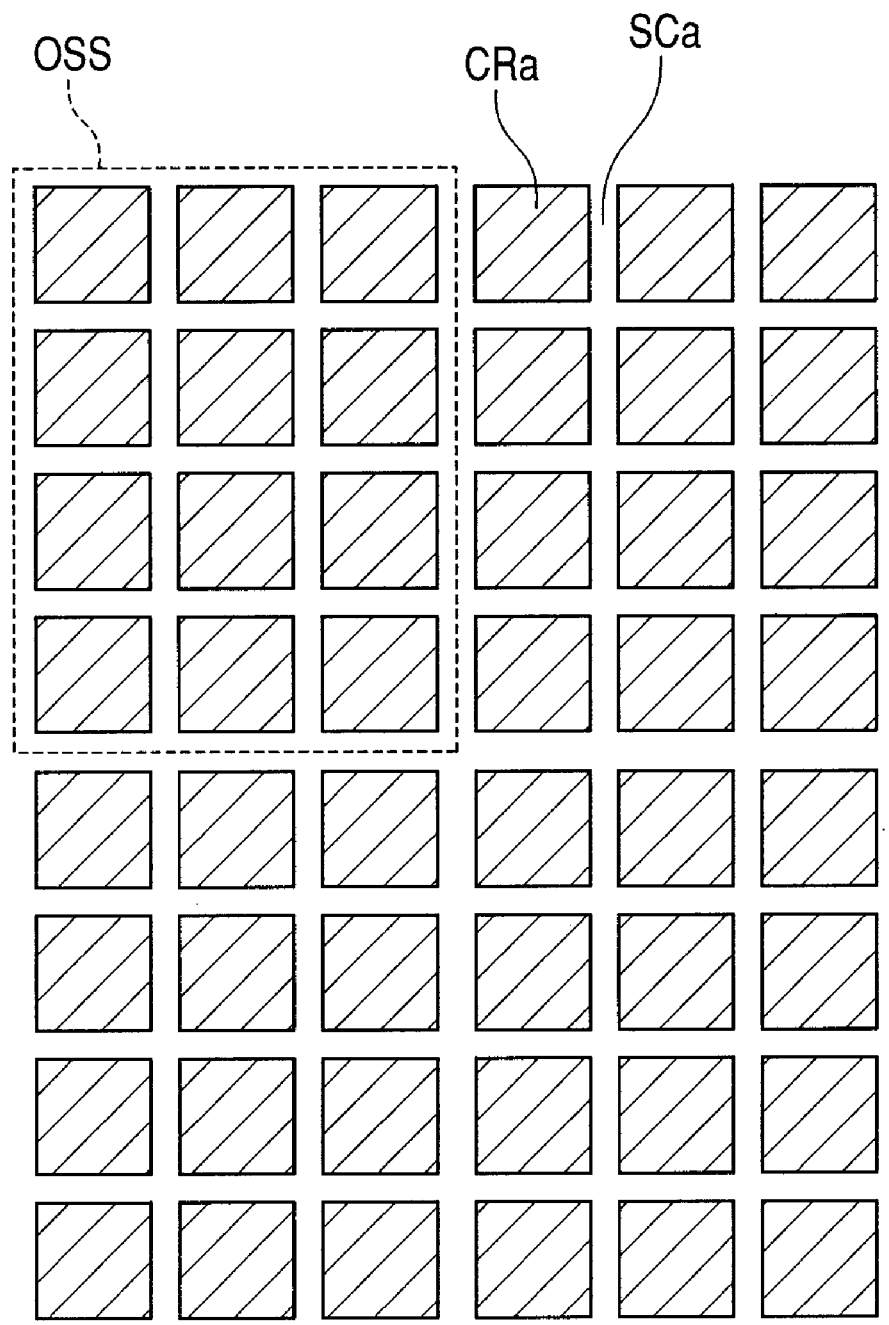
FIG. 32 is a plan view schematically illustrating a pattern of a first semiconductor wafer formed using the mask of FIG. 31.

Referring to FIG. 32, according to the photolithography using the mask RS, photolithography is performed with a shot region OSS including 12 first semiconductor chip regions CRa as a unit.

According to the present embodiment, since the multilayer mask RM is used, an area of the mask used practically in each step becomes smaller than the area when the conventional mask RS is used. Compared with the comparative example, a place in which the first region RA (FIG. 6) can be disposed becomes smaller in the present embodiment. In the present embodiment, however, the first region RA and the second region RB are arranged as a pattern in which they run parallel to each other as a plurality of lines LP along the first scribe region SCa. This makes it possible to place the first region RA more easily even if the place for the first region RA is small.

(Embodiment 4) The present embodiment is different from Embodiment 1 in the configuration of test elements TE and test electrode pads TP of the first monitor MN1$a$.

Figure 33:
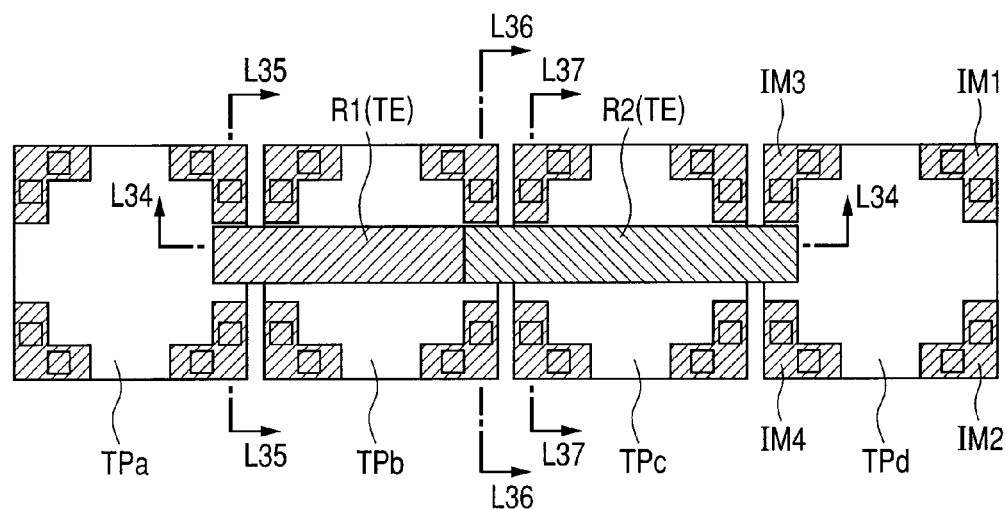
FIG. 33 is a view schematically illustrating the planar layout of a TEG in Embodiment 4 of the invention.

Referring to FIG. 33, test electrode pads TPa to TPd are arranged in a line. Immediately below the test electrode pads TPb and TPc, resistors R1 and R2 are formed as test elements TE. The resistor R1 is comprised of a first-level metal interconnect and the resistor R2 is comprised of a second-level metal interconnect. The resistor R1 is electrically coupled to the test electrode pads TPa and TPc adjacent to the test electrode pad TPb, while the resistor R2 is electrically coupled to the test electrode pads TPb and TPd adjacent to the test electrode TPc. In the configuration of TEG shown in FIG. 33, similar to the configuration of TEG in Embodiment 1, island-like metal portions are provided in each of the test electrode pads for electrical coupling between the test electrode pad and the test element. In FIG. 33, first-level island-like metal portions IM1 to IM4 are shown typically.

Figure 34:
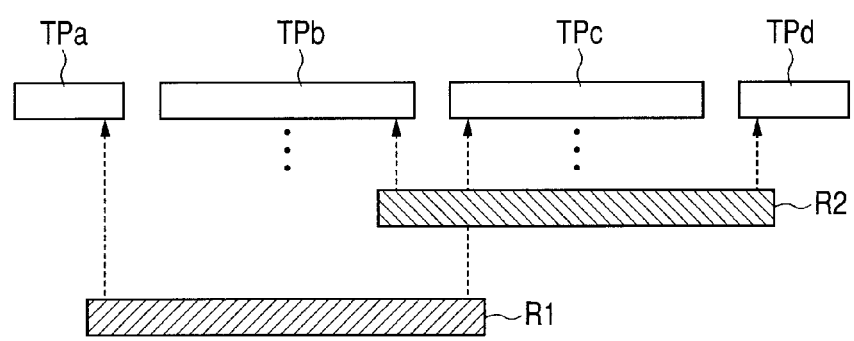
FIG. 34 is a view schematically illustrating the cross-sectional structure taken along a line L34-L34 illustrated in FIG. 33.

Referring to FIG. 34, the resistor R1 comprised of the first-level metal interconnect is disposed in a region immediately below the test electrode pad TPb. This resistor R1 extends even below the test electrode pads TPa and TPc and as shown in an arrow of a dashed line, it is electrically coupled to the test electrode pads TPa and TPc.

The resistor R2 is comprised of the second-level metal interconnect which is an upper layer of the resistor R1 and is formed in a region immediately below the test electrode pad TPc. This resistor R2 is electrically coupled to the test electrode pads TPb and TPd adjacent to the TPc (electrical coupling is indicated by an arrow).

When referred to FIG. 35, the resistor R1 is electrically coupled to the first-level island-like metal portion IM1 below the test electrode pad TPa. The first-level island-like metal portion IM1 is electrically coupled to the test electrode pad TPa through an upper-level interconnect and via such as via VA1, second-level island-like metal portion IM21 and a via. The resistor R1 is not coupled to the first-level island-like metal portion IM2. For the first-level island-like metal portion IM2 similar to the first-level island-like metal portion IM1, a via VA1, a second-level island-like metal portion IM22, and a via VA2 are formed and it is electrically coupled to the test electrode pad TPa.

Figure 36:
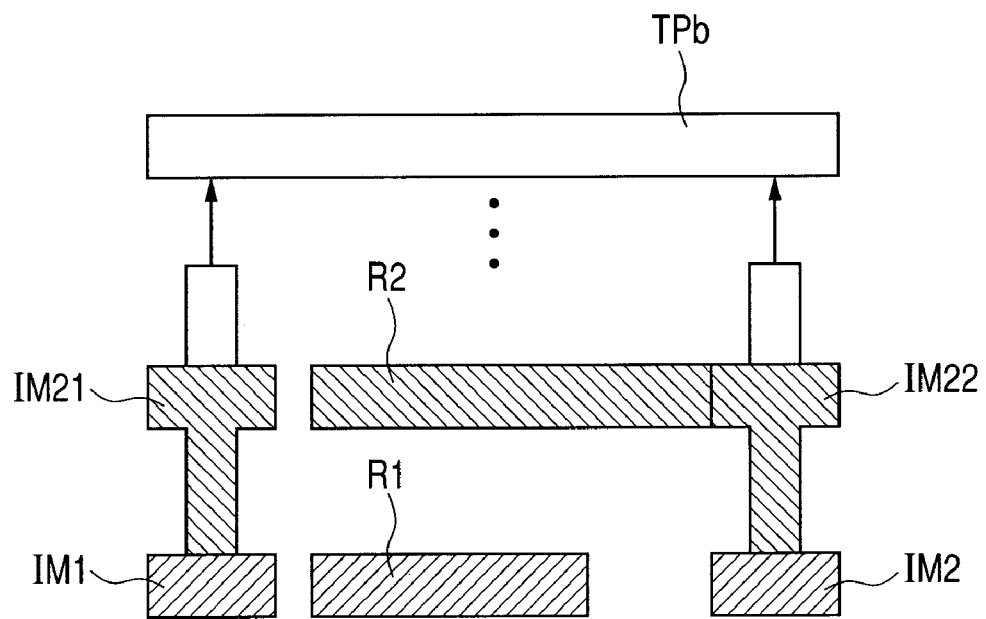
FIG. 36 is a view schematically illustrating the cross-sectional structure taken along a line L36-L36 illustrated in FIG. 33.

Referring to FIG. 36, the resistors R1 and R2 comprised of the first-level metal interconnect and the second-level metal interconnect, respectively, are formed below the test electrode pad TPb. The resistor R1 passes through a region between the first-level island-like metal portions IM1 and IM2. The resistor R2 comprised of the second-level metal interconnect is electrically coupled to the second-level island-like metal portion IM22. The second-level island-like metal portions IM22 and IM21 are electrically coupled to the test electrode pad TPb through a via and an island-like metal portion formed over the second-level island-like metal portions, respectively.

Figure 37:
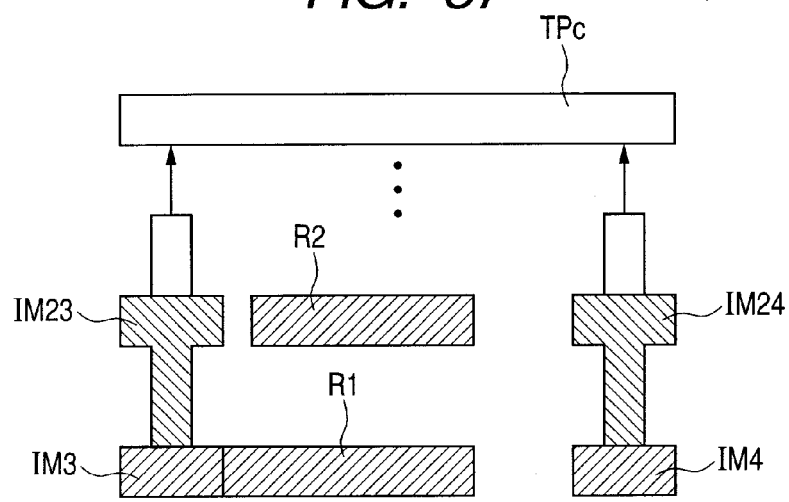
FIG. 37 is a view schematically illustrating the cross-sectional structure taken along a line L37-L37 illustrated in FIG. 33.

Referring to FIG. 37, the resistors R1 and R2 are disposed below the test electrode pad TPc. The resistor R2 comprised of the second-level metal interconnect passes through a region between second-level island-like metal portions IM23 and IM24. On the other hand, the resistor R1 is electrically coupled to a first-level island-like metal portion IM3. The second-level island-like metal portion IM24 is electrically coupled to the first-level island-like metal portion IM4 through a via. Similarly, these second-level island-like metal portions IM23 and IM24 are electrically coupled to the corresponding test electrode pad TPc through a via and an island-like metal portion formed through above these metal portions.

Accordingly, even when a resistor is comprised only of a metal interconnect, it is possible to cause an interconnect configuring a resistor to pass through a region between island-like intermediate layers formed for interconnect coupling to each test electrode pad.

By forming resistors, which are provided for electrode pads adjacent to each other, from interconnects in different interconnect layers, the resistors formed immediately below each test electrode pad can be electrically coupled to test electrode pads adjacent thereto successively without causing collision of interconnects.

When a further resistor such as resistor R3 is coupled, the resistor only extends to three test electrode pads. By disposing a first-level metal interconnect and a second-level metal interconnect alternately, resistors can be placed successively for each test electrode pad without causing collision of interconnects.

Figure 35:
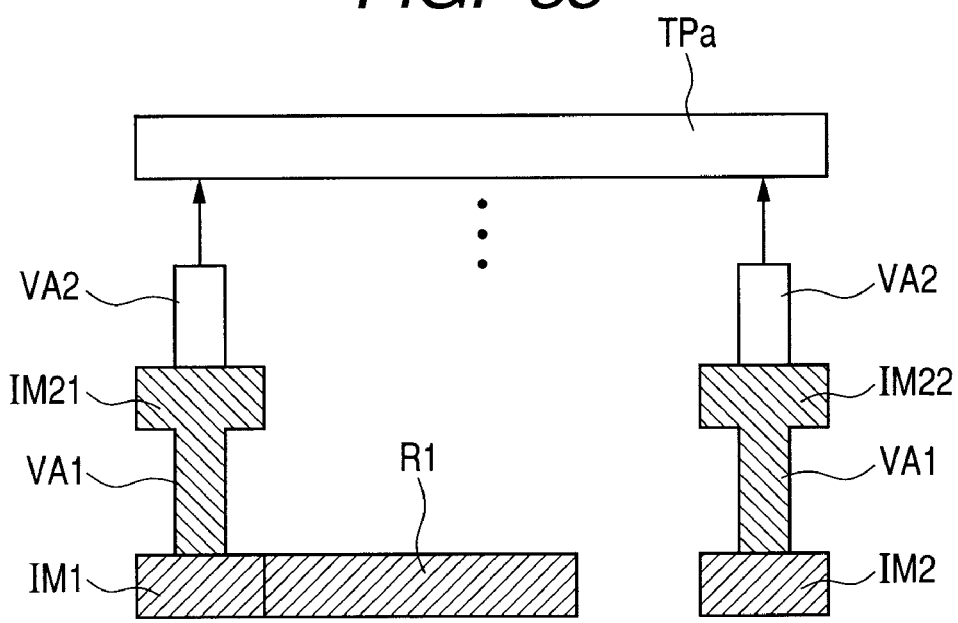
FIG. 35 is a view schematically illustrating the cross-sectional structure taken along a line L35-L35 illustrated in FIG. 33.

In the structure as illustrated in FIGS. 35 to 37, the resistors R1 and R2 are electrically coupled to one of the test electrode pads adjacent to each other. The resistor R1 illustrated in FIG. 35 may however have a wider end portion (T-shaped portion) to short-circuit the first-level island-like metal portions IM1 and IM2. The resistor R2 in FIG. 36 may be formed to short-circuit the second-level island-like metal portions IM21 and IM22. The resistor R1 in FIG. 37 may be formed to short-circuit the first-level island-like metal portions IM3 and IM4.

Incidentally, a resistor provided for a test electrode pad is measured for characteristic values such as seed resistance and it is subjected to process evaluation (film thickness/line width and evaluation of electrical characteristics of a single element). As in Embodiment 1, a copper interconnect is used as a metal interconnect and an uppermost aluminum interconnect is used for a test electrode pad. In Embodiment 4, the second-level island-like metal portion and metal portions thereabove are formed by the damascene process.

The configuration other than described above is almost similar to that of Embodiment 1 so that same or corresponding elements will be identified by the same symbols and overlapping descriptions will be omitted.

According to the present embodiment, resistors are placed as a test element and they are placed immediately below a test electrode pad. They are coupled to test electrode pads adjacent to each other with an interconnect in a different interconnect layer. As a result, resistors as TEG can be disposed at a high density for each test electrode pad and similar effects to those of Embodiment 1 can be obtained.

Manufacturing steps of these resistors R1 and R2 are similar to those of Embodiment 1. In parallel with the manufacturing steps of a semiconductor device formed over a semiconductor chip, these resistors are formed upon formation of a first-level metal interconnect and a second-level metal interconnect, respectively.

A testing method is similar to that employed in Embodiment 1 and the TEG composed of even-numbered test electrode pads and TEG composed of odd-numbered test electrode pads are tested by shifting a probe pin by a pitch of an electrode pad, that is, ½ times the pitch of the probe bin.

Figure 38:
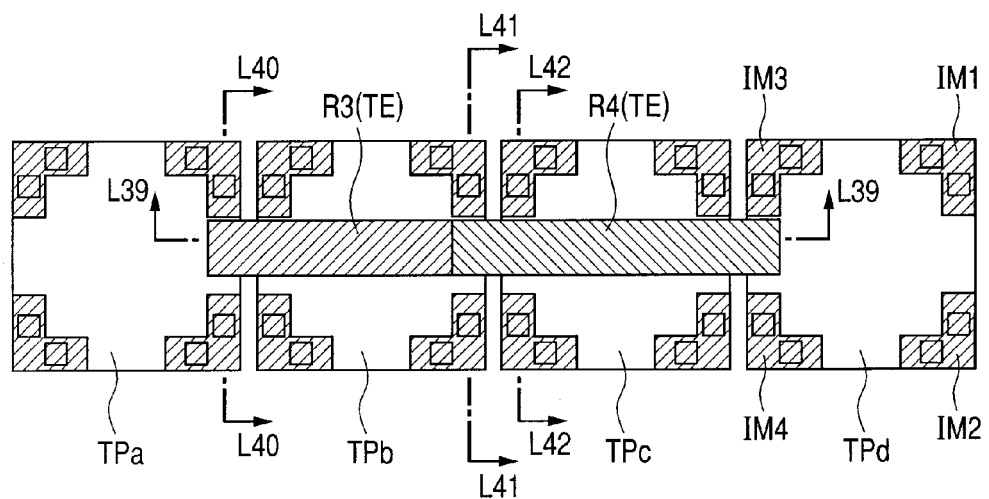
FIG. 38 is a view schematically illustrating the planar layout of a TEG in a modification example of Embodiment 4 of the invention.

(Modification Example) When referred to FIG. 38, the planar layout of this modification example is different in the following arrangement from the planar layout illustrated in FIG. 33. Described specifically, test electrode pads TPb and TPc have, in a region immediately therebelow, resistors R3 and R4 as a test element TE. The resistor R3 is comprised of a polysilicon interconnect and the resistor R4 is comprised of a first-level metal interconnect. The resistor R3 is electrically coupled to test electrode pads TPa and TPc adjacent to the test electrode pad TPb, while the resistor R4 is electrically coupled to test electrode pads TPb and TPd adjacent to the test electrode pad TPc. The other configuration, that is, the configuration of TEG illustrated in FIG. 38 is similar to that of the planar layout illustrated in FIG. 33. The same reference numeral is given to portions corresponding to those of FIG. 33 and detailed description on them is omitted. Also in the planar layout shown in FIG. 38, similar to the planar layout shown in FIG. 33, island-like metal portions are provided for each test electrode pad so as to electrically couple the test electrode pad and a test element. Also in FIG. 38, similar to FIG. 33, first-level island-like metal portions IM1 to IM4 are illustrated typically.

Figure 39:
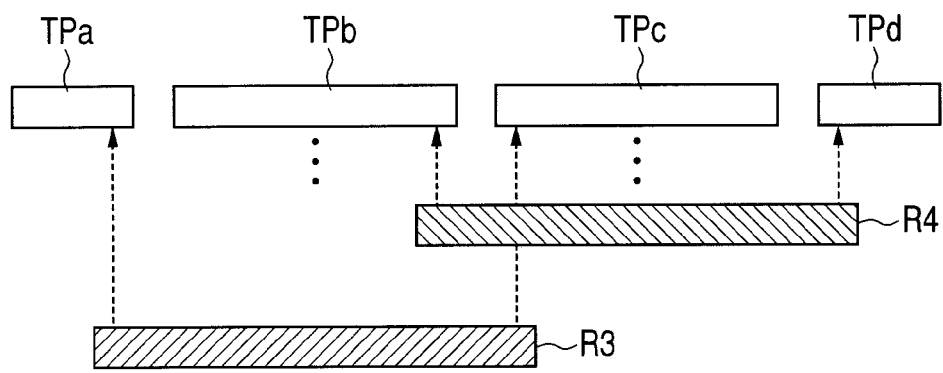
FIG. 39 is a view schematically illustrating the cross-sectional structure taken along a line L39-L39 illustrated in FIG. 38.

When referred to FIG. 39, the cross-sectional structure shown in FIG. 39 is similar to that illustrated in FIG. 34 except that resistors R3 and R4 are comprised of a polysilicon interconnect and a first-level metal interconnect, respectively. Portions corresponding to those of the structure shown in FIG. 34 are denoted with the same reference symbols and a detailed description on them is omitted.

In this layout illustrated in FIG. 39, the resistor R3 extends even below the test electrode pad TPa and TPc. As indicated with an arrow of a dashed line, the resistor R3 is electrically coupled to the test electrode pads TPa and TPc.

The resistor R4 is comprised of the first-level metal interconnect located above the resistor R3 and it is formed in a region immediately below the test electrode pad TPc. This resistor R4 is electrically coupled to the test electrode pads TPb and TPd adjacent to the test electrode pad TPc (electrical coupling is shown by an arrow)). Even when the resistors are formed as TEG by making use of interconnects in a different interconnect layer, it is therefore possible to provide island-like metal portions below the test electrodes and thereby place resistors without changing the layout of the test electrodes.

Figure 40:
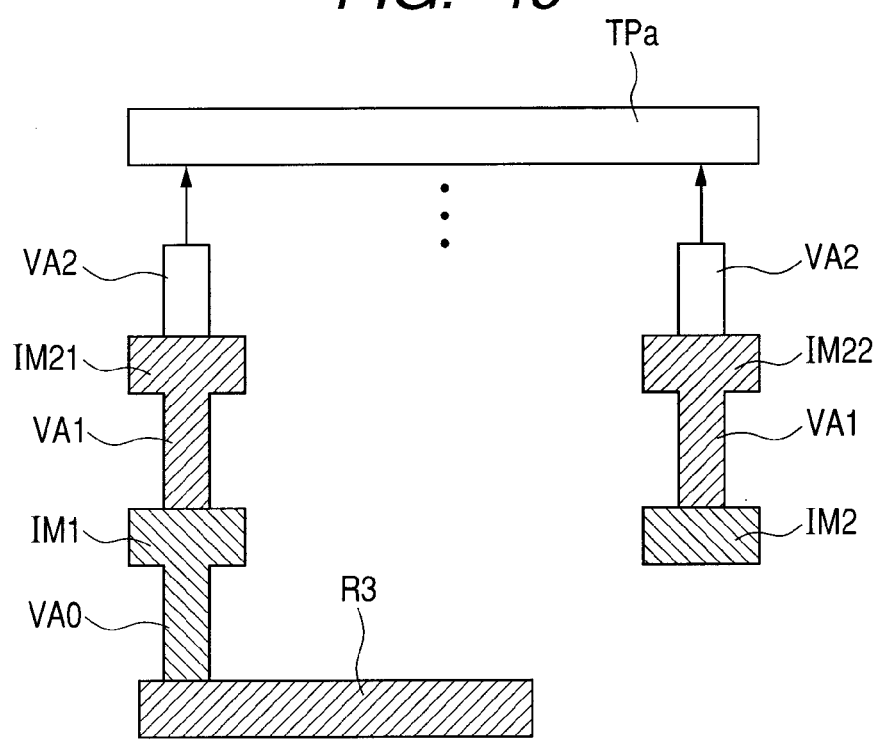
FIG. 40 is a view schematically illustrating the cross-sectional structure taken along a line L40-L40 illustrated in FIG. 38.

When referred to FIG. 40, the cross-sectional structure shown therein is different from the cross-sectional structure illustrated in FIG. 34 in the following point. Described specifically, the resistor R3 extends even below the first-level island-like metal portion IM1 below the test electrode pad TPa and is electrically coupled to the first-level island-like metal portion IM1 through a via (tungsten plug) VA0. The other layout of the cross-sectional structure illustrated in FIG. 40 is similar to the layout in FIG. 35 and corresponding portions will be identified by the same reference symbols and overlapping descriptions will be omitted.

Figure 41:
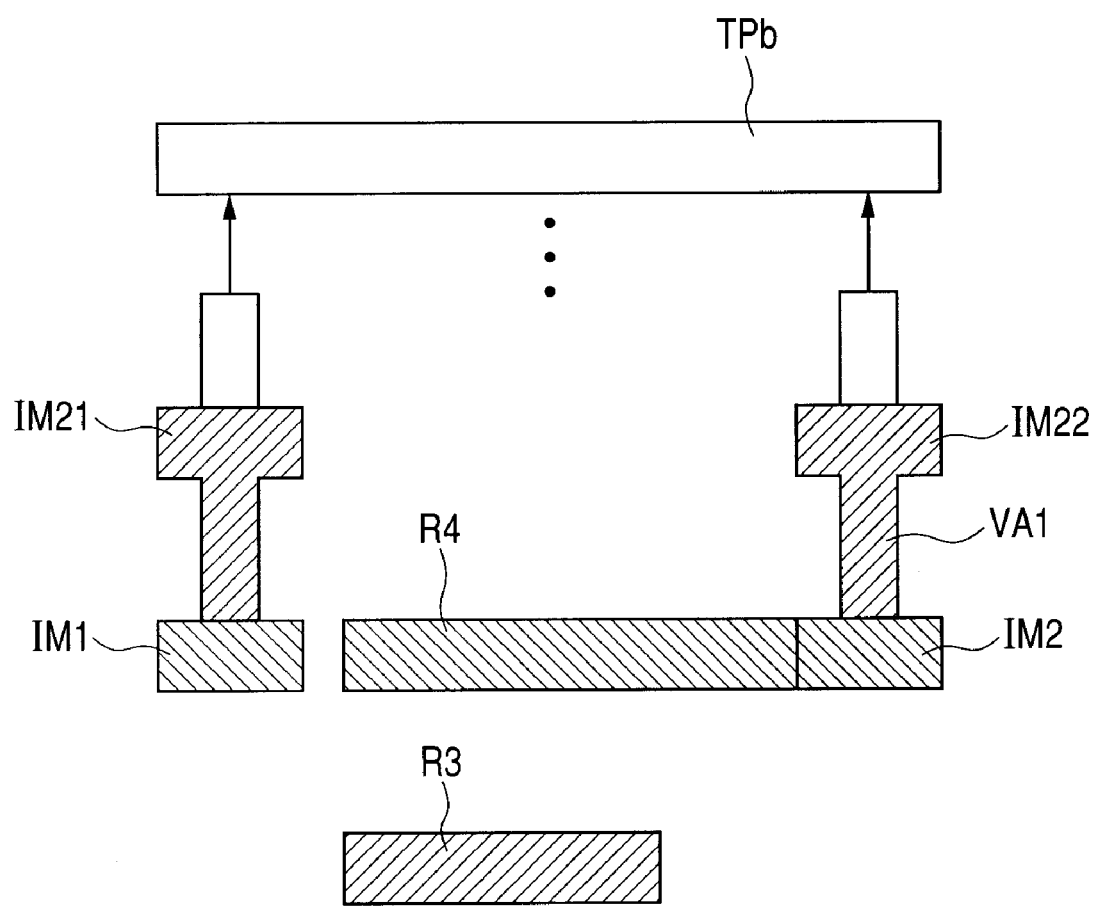
FIG. 41 is a view schematically illustrating the cross-sectional structure of the TEG taken along a line L41-L41 illustrated in FIG. 38.

When referred to FIG. 41, the cross-sectional structure shown therein is different in layout from the cross-sectional structure illustrated in FIG. 36. Described specifically, below the test electrode pad TPb, the resistor R3 comprised of a polysilicon interconnect passes below a region between first-level island-like metal portions IM1 and IM2 provided for the test electrode pad TPb. On the other hand, the resistor R4 comprised of the first-level metal interconnect is electrically coupled to the first-level island-like metal portion IM2. This first-level island-like metal portion IM2 is electrically coupled to a second-level island-like metal portion through a via (plug) VA1. First-level island-like metal portions IM22 and IM21 are electrically coupled to the test electrode pad TPb through a via and an island-like metal portion formed over them. The other layout in the cross-sectional structure illustrated in FIG. 41 is similar to the layout in FIG. 36 and corresponding portions will be identified by the same reference symbols and overlapping descriptions will be omitted.

Figure 42:
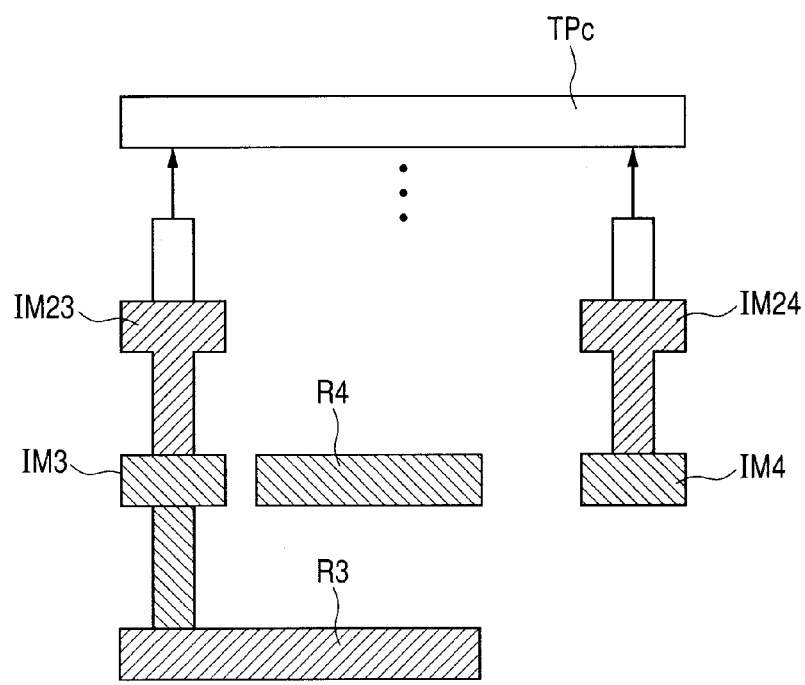
FIG. 42 is a schematic view illustrating the cross-sectional structure taken along a line L42-L42 illustrated in FIG. 38.

When referred to FIG. 42, the cross-sectional structure shown therein is different from the cross-sectional structure shown in FIG. 37 in the following point. Also in FIG. 42, the test electrode pad TPc has therebelow resistors R3 and R4. The resistor R4 comprised of a first-level metal interconnect passes through a region between first-level island-like metal portions IM3 and IM4. On the other hand, the resistor R3 comprised of a polysilicon interconnect is electrically coupled to a first-level island-like metal portion IM3 through a via (tungsten plug) VA0.

In this structure, similar to the structure illustrated in FIG. 37, a first-level island-like metal portion IM4 is electrically coupled to a second-level island-like metal portion IM24 through a via. These second-level island-like metal portions IM23 and IM24 are also electrically coupled to the corresponding test electrode pad TPc through a via and an island-like metal portion thereabove.

Even when resistors are comprised of a polysilicon interconnect and a first-level metal interconnect, respectively, it is possible to cause the interconnects configuring the resistors to pass through a region between island-like intermediate layers formed for interconnect coupling to each test electrode pad. Even in the configuration of this modification example, advantages similar to those available from the configuration of FIGS. 33 to 37 can be obtained. In addition, the testing method can be performed in a manner similar to that employed in Embodiment 1.

According to Embodiment 4 of the invention as described above, resistors are disposed as a test element, placed immediately below a test electrode pad, and coupled to test electrode pads adjacent thereto, respectively, with interconnects in different interconnect layers. As a result, resistors can be placed in TEG at a high density for each test electrode pad and advantages similar to those of Embodiment 1 can be achieved.

Embodiment 1 and Embodiment 2 may be used in combination to place, in TEG, a transistor element and a resistor below test electrode pads different from each other, respectively. This means that the test elements TEo and TEe illustrated in FIG. 21 may be a transistor element and a resistor, respectively. The polysilicon interconnect may be formed in a similar step to that for the formation of a gate electrode of a MOS transistor.

Further, as a test element, a MOS transistor and a resistor are used. As the test element, active elements (such as transistor) and passive elements (such as resistor and capacitor) other than the above-described ones may be used. For example, a bipolar transistor and/or capacitor may be used for evaluation of the characteristics of process or circuit, or evaluation of reliability.

(Embodiment 5) The configuration of a test element TE and a test electrode pad TP of a first monitor MN1a in the present embodiment is different from that of Embodiment 1 and Embodiment 4.

Figure 43:
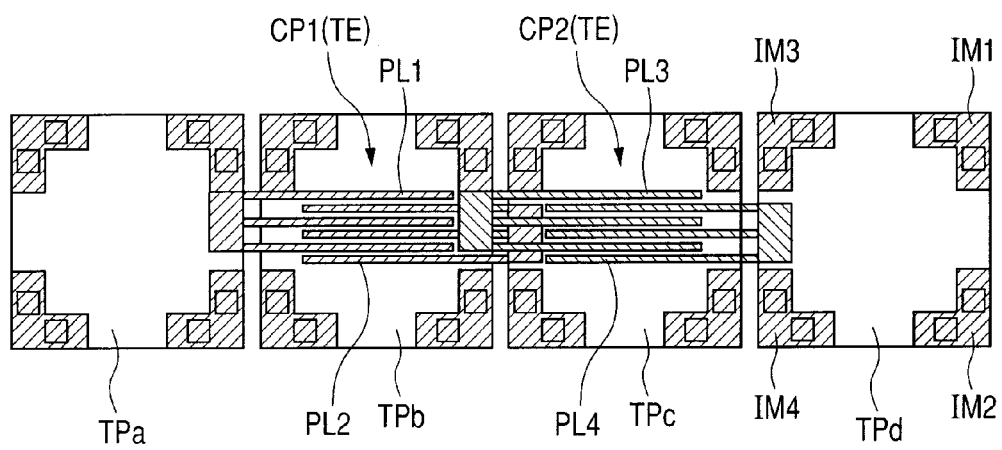
FIG. 43 is a view schematically illustrating the planar layout of a TEG in Embodiment 5 of the invention.

When referred to FIG. 43, test electrode pads TPa to TPd are arranged in a line as in Embodiment 4. Capacitors CP1 and CP2 are placed as TEG in a region immediately below test electrode pads TPb and TPc, respectively. The capacitor CP1 has electrode interconnects PL1 and PL2 having comb's tooth portions, respectively, and they are disposed so as to engage with each other at the comb's tooth portions. The electrode interconnects PL1 and PL2 are comprised of a first-level metal interconnect and electrically coupled to the test electrode pads TPa and TPc, respectively.

The capacitor CP2 has electrode interconnects PL3 and PL4 comprised of a second-level interconnect and similar to the capacitor CP1, they have comb's tooth portions disposed opposite to each other.

These capacitors CP1 and CP2 form a capacitance at comb's tooth portions of the same interconnect layer disposed opposite to each other. By forming the electrode interconnects PL1, PL2, PL3, and PL4 in a comb-like form, it is possible to enlarge the opposing areas of the capacitor electrodes, thereby achieving a desired capacitance.

Incidentally, in the electrode interconnects PL1 to PL4 of these capacitors, the comb's tooth portions are linked to rectangular regions formed continuously and in these rectangular regions, they are electrically coupled to the island-like metal portions of the corresponding test electrode pads. Accordingly, these electrode interconnects PL1 to PL4 have a cross-sectional structure similar to that illustrated in FIGS. 34 to 37.

These electrode interconnects PL1, PL2, PL3, and PL4 are formed by making use of a step similar to that for manufacturing a semiconductor device over a semiconductor chip in Embodiment 1.

Figure 44:
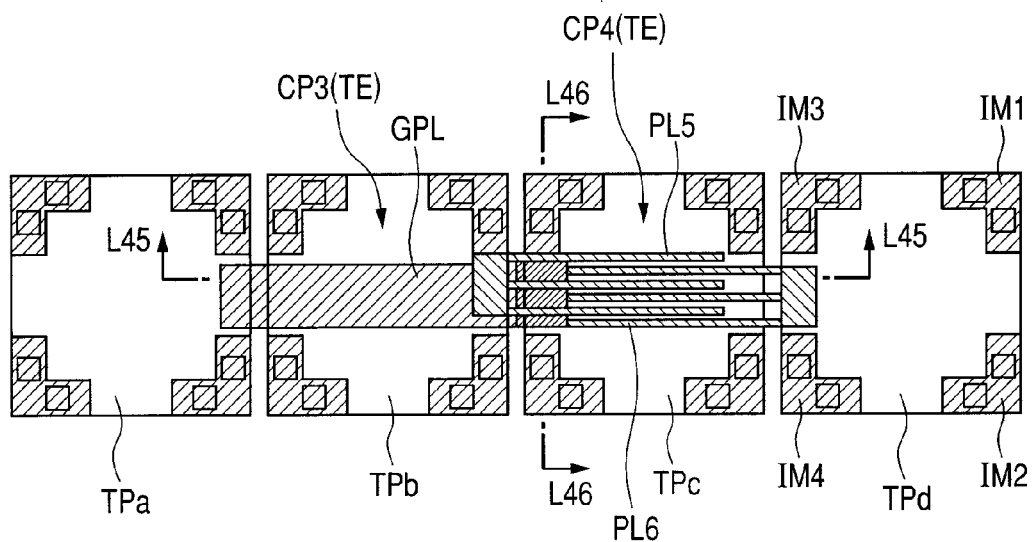
FIG. 44 is a view schematically illustrating the planar layout of a TEG in a modification example in Embodiment 5 of the invention.

Electrodes of the capacitors CP1 and CP2 are electrically coupled to the test electrode pads adjacent to the test electrode pads in which the capacitors CP1 and CP2 are placed, respectively so that electrical characteristics and the like of the capacitors CP1 and CP2 can be measured as in Embodiment 1. (Modification Example) When referred to FIG. 44, capacitors CP3 and CP4 are disposed as TEG also in this modification example. The planar layout of the capacitors CP3 and CP4 illustrated in FIG. 44 is different from the planar layout of TEG illustrated in FIG. 43 in the following point. Described specifically, the capacitor CP3 has an electrode interconnect GPL having an electrode comprised of a plate-like polysilicon interconnect and an electrode interconnect comprised of an active region AR illustrated in FIG. 45 formed in the surface of a semiconductor chip. These electrode interconnect GPL and active region AR are disposed opposite to each other via a gate insulating film not illustrated. The gate insulating film is utilized as a capacitor insulating film.

Electrode interconnects PL5 and PL6 of the capacitor CP4 are comprised of a first-level metal interconnect and similar to Embodiment 5, they have comb's tooth portions disposed so as to engage with each other. With the comb's tooth portions disposed so as to face with each other, capacitance is formed.

The planar layout of FIG. 44 other than the above-described layout is the same as that illustrated in FIG. 43 so that corresponding portions will be identified by the same reference symbols and detailed description on it will be omitted.

Figure 45:
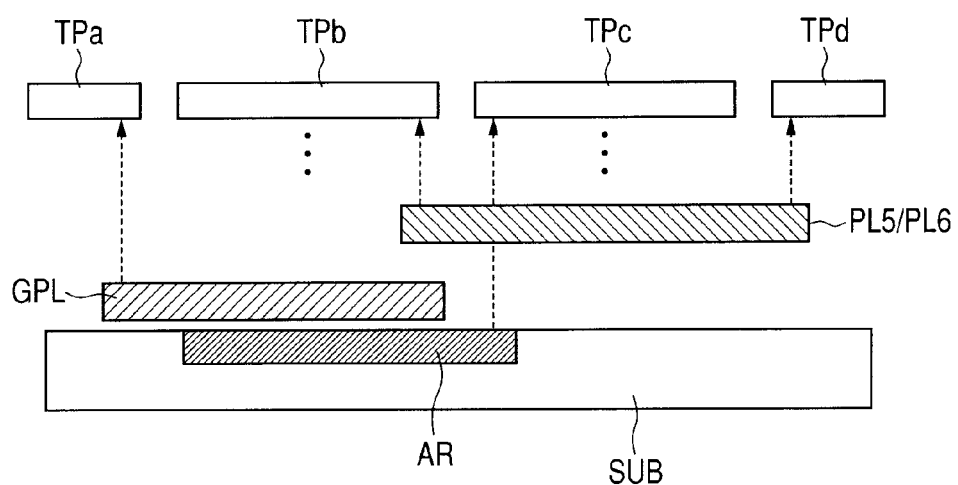
FIG. 45 is a view schematically illustrating the cross-sectional structure taken along a line L45-L45 illustrated in FIG. 44.

Referring to FIG. 45, the active region (impurity region) AR is formed in the surface of the semiconductor substrate SUB which will be a scribe region. Over the surface of the active region AR, a polysilicon electrode interconnect GPL in this diagram is placed via the gate insulating film not illustrated. The polysilicon electrode interconnect GPL is formed by the same step as that for forming a gate electrode of a MOS transistor (insulating gate field effect transistor) to be formed in the first semiconductor chip region CRa and the active region is formed by the same manufacturing step as that of a source/drain formation step of the MOS transistor.

The polysilicon electrode interconnect GPL is electrically coupled to the test electrode pad TPa via the island-like metal portion of the test electrode pad TPa as shown by a dashed line. The active region AR is electrically coupled to the test electrode pad TPc via a corresponding island-like metal portion shown by a dashed line.

The electrode interconnects PL5 and PL6 of the capacitor CP4 are comprised of first metal interconnects of the same layer and electrically coupled to the test electrode pad TPb and TPd via the island-like metal portion shown by a dashed line.

Figure 46:
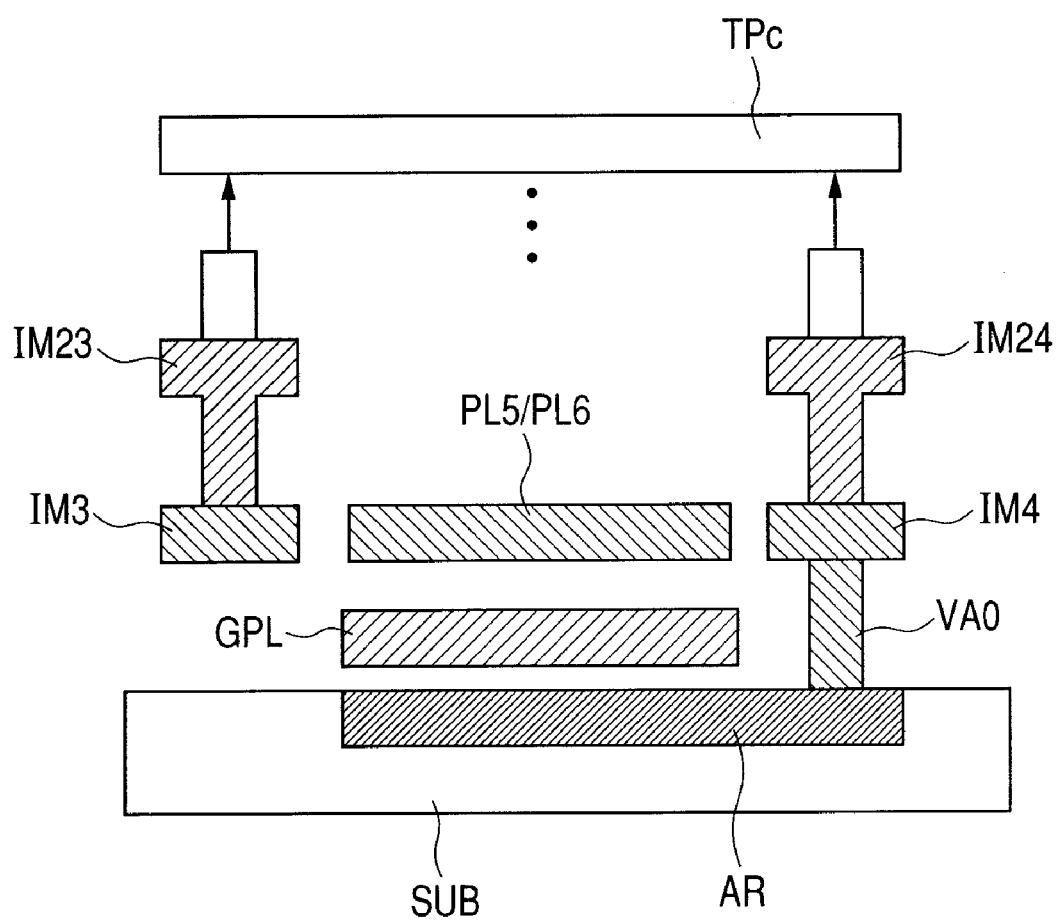
FIG. 46 is a view schematically illustrating the cross-sectional structure taken along a line L46-L46 illustrated in FIG. 44.

When referred to FIG. 46, the active region AR formed in the surface of the semiconductor substrate SUB is electrically coupled to a first-level island-like metal portion IM4 through a via (tungsten plug) VA0 and this first-level island-like metal portion IM4 is electrically coupled to the test electrode pad TPc through a via, a second-level island-like metal portion IM24, and an island-like metal portion and a via thereabove. Between the first-level island-like metal portions IM3 and IM4, the electrode interconnects PL5 and PL6 of the capacitor CP2 comprised of the first-level metal interconnect is placed. Between the electrode interconnects PL5 and PL6 and the active region AR, the polysilicon electrode interconnect GPL is disposed.

The capacitor CP3 is formed in a portion where the polysilicon electrode interconnect GPL and the active region AR overlap with each other in a planar view. As a result, even if the width of the active region AR is enlarged below the test electrode pad TPc, there occurs no particular influence on the capacitance of the capacitor CP3.

Although the cross-sectional structure of an electrical coupling portion between the test electrode pads TPb and TPd to the electrode interconnects PL5 and PL6 of the capacitor CP4 is not shown, the electrode interconnects are electrically coupled to the corresponding test electrode pads by the layout similar to that of the cross-sectional structure illustrated in FIG. 41.

Although the active region AR in the cross-sectional structure illustrated in FIG. 46 is electrically coupled to the first-level island-like metal portion IM4, the active region AR may be electrically coupled to both the first-level island-like metal portions IM3 and IM4.

The configuration other than that described above is almost similar to the configuration of the above-described Embodiment 1 so that same or corresponding elements will be identified by the same symbols and overlapping descriptions will be omitted.

According to the present embodiment, capacitors are placed as a test element; they are placed immediately below the test electrode pads, respectively; and they are coupled to test electrode pads adjacent to the test electrode pad having the capacitor immediately therebelow with interconnects in different interconnect layers. Accordingly, capacitors can be placed in TEG at a high density for each test electrode pad and an advantage similar to that obtained in Embodiment 1 can be obtained.

Incidentally, Embodiments 1, 4, and 5 may be used in combination as needed. As TEG, a transistor element, a capacitor, and a resistor may be placed below test electrode pads different from each other, respectively. For example, the test elements TEo and TEe illustrated in FIG. 21 may be a transistor element and a capacitor, respectively. As one example, a resistor may be comprised of an upper-level metal interconnect and a lower-level metal interconnect or polysilicon interconnect may be disposed a capacitor electrode.

The embodiments disclosed herein should not be taken by way of limitation but illustrative in all respects. It is intended that the scope of the present invention be expressed by the terms of the appended claims rather than by the above-mentioned description and all the modifications within the meaning and scope of the claims and their equivalents be included.

The present invention is suited for use particularly in a manufacturing method of a semiconductor device having a step of cutting a semiconductor wafer.

What is claimed is:

1. A manufacturing method of a semiconductor device comprising the steps of:
   forming a first semiconductor wafer having a plurality of first semiconductor chip regions and a first scribe region; and
   cutting off a portion of the first scribe region of the first semiconductor wafer to separate the first semiconductor chip regions into individual first semiconductor chips,
   wherein in a portion of the first scribe region sandwiched between the first semiconductor chip regions, a first region in which at least one monitor is placed, selected from a first monitor for electrically evaluating at least either one of an active element and a passive element, a second monitor for dimensional control, and a third monitor for measuring film thickness and a second region in which an alignment mark for lithography is placed are placed in parallel to each other, and
   wherein in the cutting step, the first region is cut off.

2. The manufacturing method of a semiconductor device according to claim 1,
   wherein the first semiconductor chip regions each has an internal circuit region and a seal ring SR surrounding the internal circuit region therewith,
   wherein the first semiconductor chip formed by the cutting step is surrounded, in a planar view, with a first chip end face, a second chip end face, a third chip end face, and a fourth chip end face,
   wherein the seal ring is surrounded, in a planar view, a first side placed so as to run along the first chip end face, a second side placed so as to run along the second chip end face, a third side placed so as to run along the third chip end face, and a fourth side placed so as to run along the fourth chip end face, wherein the first side and the third side are parallel to each other, while the second side and the fourth side are parallel to each other, wherein the first chip end face and the third chip end face are parallel to each other, while the second chip end face and the fourth chip end face are parallel to each other, and wherein a distance between the first chip end face and the first side is greater than a distance between the third chip end face and the third side, while a distance between the second chip end face and the second side is greater than a distance between the fourth chip end face and the fourth side.

3. The manufacturing method of a semiconductor device according to claim 2, wherein at least a portion of the second region is placed between the first chip end face and the first side, wherein the second region has, in a planar view, a long side parallel to the first side and a short side perpendicular to the first side, and wherein in the cutting step, by carrying out either one of an operation of cutting off a portion of the second region in a direction perpendicular to the long side and an operation of not cutting off the second region, at least a portion of the second region is left over the first semiconductor chip.

4. The manufacturing method of a semiconductor device according to claim 3, wherein the first monitor is formed in the first region, wherein a plurality of pads for measuring electrical characteristics of the first monitor are placed in a third region in the first scribe region, wherein in a portion of the first scribe region sandwiched between the first semiconductor chip regions, the third region is placed in parallel to the first monitor, and wherein even after the cutting step, at least a portion of the third region is left over the first semiconductor chip.

5. The manufacturing method of a semiconductor device according to claim 1, wherein the step of forming a first semiconductor wafer includes a photolithography step using a multilayer mask.

6. The manufacturing method of a semiconductor device according to claim 1, wherein the active element is a transistor and the passive element is either one of a resistor or a capacitor.

7. The manufacturing method of a semiconductor device according to claim 1, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

8. The manufacturing method of a semiconductor device according to claim 2, wherein the step of forming a first semiconductor wafer includes a photolithography step using a multilayer mask.

9. The manufacturing method of a semiconductor device according to claim 2, wherein the active element is a transistor and the passive element is either one of a resistor or a capacitor.

10. The manufacturing method of a semiconductor device according to claim 2, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

11. The manufacturing method of a semiconductor device according to claim 3, wherein the step of forming a first semiconductor wafer includes a photolithography step using a multilayer mask.

12. The manufacturing method of a semiconductor device according to claim 3, wherein the active element is a transistor and the passive element is either one of a resistor or a capacitor.

13. The manufacturing method of a semiconductor device according to claim 3, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

14. The manufacturing method of a semiconductor device according to claim 4, wherein the step of forming a first semiconductor wafer includes a photolithography step using a multilayer mask.

15. The manufacturing method of a semiconductor device according to claim 4, wherein the active element is a transistor and the passive element is either one of a resistor or a capacitor.

16. The manufacturing method of a semiconductor device according to claim 4, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

17. The manufacturing method of a semiconductor device according to claim 5, wherein the active element is a transistor and the passive element is either one of a resistor or a capacitor.

18. The manufacturing method of a semiconductor device according to claim 5, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

19. The manufacturing method of a semiconductor device according to claim 6, wherein the cutting step for forming the first semiconductor chips is carried out by cutting off the first scribe region of the first semiconductor wafer with a dicer, wherein the manufacturing method further comprises the steps of: forming a second semiconductor wafer having a plurality of second semiconductor chip regions and a second scribe region and cutting off a portion of the second scribe region from the second semiconductor wafer to separate the second semiconductor chip regions into individual second semiconductor chips, wherein in the second scribe region sandwiched between the second semiconductor chip regions, a fourth region in which at least one monitor is placed, selected from a fourth monitor for electrically evaluating at least either one of an active element and a passive element, a fifth monitor for carrying out dimensional control, and a sixth monitor for measuring film thickness and a fifth region in which an alignment mark for lithography is placed are arranged in a line, and wherein the cutting step in the step of forming the second semiconductor chips is performed by cutting off at least a portion of the second scribe region from the second semiconductor wafer with the dicer.

* * * * *